(12) United States Patent
Wang et al.

(10) Patent No.: US 10,992,318 B2
(45) Date of Patent: Apr. 27, 2021

(54) CODING METHOD AND APPARATUS, AND DEVICE

(71) Applicant: HUAWEI TECHNOLOGIES CO., LTD., Guangdong (CN)

(72) Inventors: Jian Wang, Hangzhou (CN); Gongzheng Zhang, Gongzheng (CN); Hejia Luo, Hangzhou (CN); Chaolong Zhang, Hangzhou (CN); Rong Li, Hangzhou (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 16/673,589

(22) Filed: Nov. 4, 2019

(65) Prior Publication Data

US 2020/0067533 A1 Feb. 27, 2020

Related U.S. Application Data

(63) Continuation of application No. PCT/CN2018/085635, filed on May 4, 2018.

(30) Foreign Application Priority Data

May 5, 2017 (CN) .......................... 201710313961.1

(51) Int. Cl.
*H03M 13/13* (2006.01)
*H03M 13/27* (2006.01)
*H04L 1/00* (2006.01)

(52) U.S. Cl.
CPC ....... *H03M 13/13* (2013.01); *H03M 13/2778* (2013.01); *H04L 1/0057* (2013.01); *H04L 1/0071* (2013.01)

(58) Field of Classification Search
CPC .......... G01R 31/3177; G01R 31/31716; G01R 31/31723; G01R 31/318536; G01R 31/31721
See application file for complete search history.

(56) References Cited

U.S. PATENT DOCUMENTS

| 2015/0194987 A1 | 7/2015 | Li et al. |
| 2016/0164629 A1 | 6/2016 | Ahn et al. |

(Continued)

FOREIGN PATENT DOCUMENTS

| CN | 103023618 A | 4/2013 |
| CN | 103684477 A | 3/2014 |

(Continued)

OTHER PUBLICATIONS

English Translation of the International Search Report, International Searching Authority, State Intellectual Property Office of the P.R. of China, Beijing, China, pp. 1-2, Jul. 25, 2018. (Year: 2018).*

(Continued)

*Primary Examiner* — Kyle Vallecillo
(74) *Attorney, Agent, or Firm* — Womble Bond Dickinson (US) LLP

(57) ABSTRACT

This application provides a coding method and apparatus, and a device. The method includes: dividing, by a sending device, a subchannel location sequence number set into at least two mutually exclusive subsets based on an interleaving operation, where a subchannel location in each subset still belongs to the subset and does not belong to another subset after any quantity of interleaving operations are performed; determining, by the sending device, an information bit location set and a frozen bit location set of a to-be-coded polar polar code based on the at least two mutually exclusive subsets; and coding, by the sending device, the to-be-coded polar code based on the information bit location set and the frozen bit location set. The coding (Continued)

---

A sending device divides a subchannel location sequence number set into at least two mutually exclusive subsets based on an interleaving operation, where a subchannel location in each subset still belongs to the subset and does not belong to another subset after any quantity of interleaving operations are performed — 801

The sending device determines an information bit location set and a frozen bit location set of a to-be-coded polar polar code based on the at least two mutually exclusive subsets — 802

The sending device codes the to-be-coded polar code based on the information bit location set and the frozen bit location set — 803 method and apparatus, and the device provided in this application can improve communication performance of polar coding.

17 Claims, 8 Drawing Sheets

(56) References Cited

U.S. PATENT DOCUMENTS

| | | | |
|---|---|---|---|
| 2017/0324514 A1 | 11/2017 | Shen et al. | |
| 2018/0048334 A1* | 2/2018 | Sarkis | H04L 1/0057 |
| 2018/0198469 A1* | 7/2018 | Sarkis | H03M 13/611 |
| 2018/0198564 A1* | 7/2018 | Yang | H04L 1/0067 |
| 2018/0323809 A1* | 11/2018 | Lin | H04L 1/0045 |
| 2018/0351695 A1* | 12/2018 | Yang | H04L 1/0045 |
| 2018/0351696 A1* | 12/2018 | Yang | H04L 1/0057 |
| 2018/0375615 A1* | 12/2018 | Xu | H04L 1/0068 |
| 2019/0052418 A1* | 2/2019 | Li | H04L 1/1896 |
| 2019/0372713 A1* | 12/2019 | Xu | H04L 1/0061 |
| 2020/0036476 A1* | 1/2020 | Yang | H04L 1/0014 |
| 2020/0067529 A1* | 2/2020 | Hui | H04L 1/0041 |
| 2020/0099469 A1* | 3/2020 | Jiang | H04L 1/0057 |

FOREIGN PATENT DOCUMENTS

| | | |
|---|---|---|
| CN | 108696333 A | 10/2018 |
| CN | 107113090 B | 11/2019 |
| EP | 3595209 A1 | 1/2020 |
| WO | 2016119105 A1 | 8/2016 |

OTHER PUBLICATIONS

English Translation of the Written Opinion of the International Searching Authority, International Searching Authority, State Intellectual Property Office of the P.R. of China, Beijing, China, pp. 1-4, Jul. 25, 2018. (Year: 2018).*

Huawei Hisilicon: "Details of the Polar code design",3GPP DRAFT; R1-1611254, Nov. 13, 2016 (Nov. 13, 2016), XP051175235,total 17 pages.

R1-162161 Huawei, HiSilicon,"Overview of Polar Codes ",3GPP TSG RAN WG1 Meeting #84bis,Busan, Korea, Apr. 11-15, 2016,total 7 pages.

R1-1702585 Qualcomm Incorporated,"SS burst composition and time index indication considerations",3GPP TSG-RAN WG1 NR #88 ,Athens, Greece Feb. 13-17, 2017,total 6 pages.

* cited by examiner

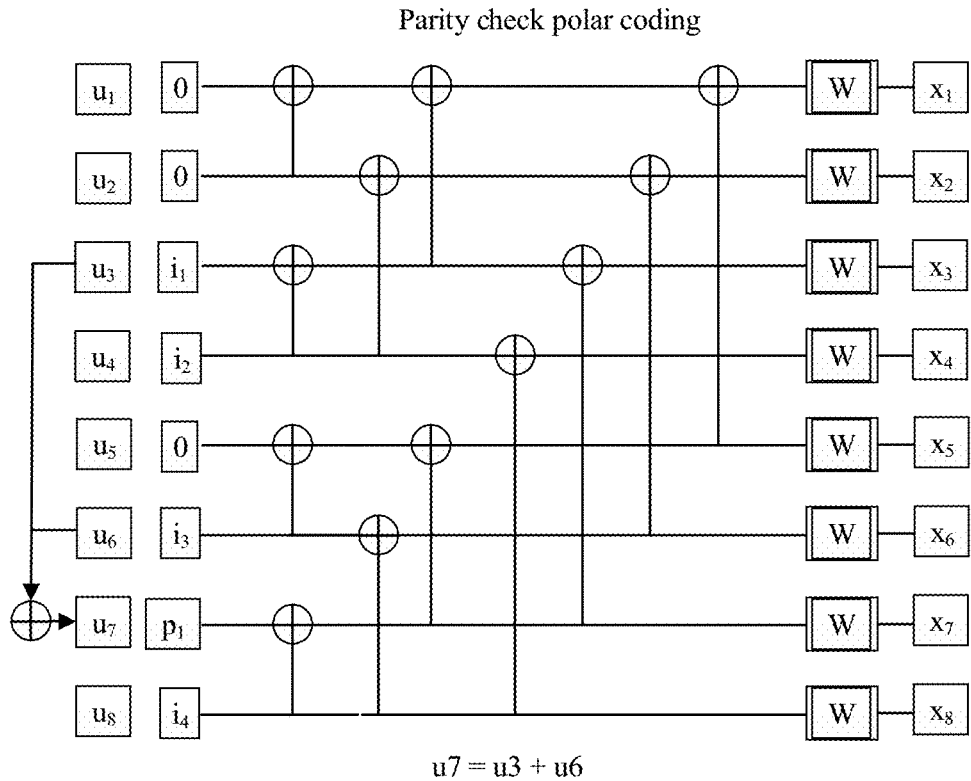

FIG. 7

| A sending device divides a subchannel location sequence number set into at least two mutually exclusive subsets based on an interleaving operation, where a subchannel location in each subset still belongs to the subset and does not belong to another subset after any quantity of interleaving operations are performed | 801 |

| The sending device determines an information bit location set and a frozen bit location set of a to-be-coded polar polar code based on the at least two mutually exclusive subsets | 802 |

| The sending device codes the to-be-coded polar code based on the information bit location set and the frozen bit location set | 803 |

FIG. 8

CODING METHOD AND APPARATUS, AND DEVICE

CROSS-REFERENCE TO RELATED APPLICATIONS

This application is a continuation of International Application No. PCT/CN2018/085635, filed on May 4, 2018, which claims priority to Chinese Patent Application No. 201710313961.1, filed on May 5, 2017. The disclosures of the aforementioned applications are hereby incorporated by reference in their entireties.

TECHNICAL FIELD

This application relates to communications technologies, and in particular, to a coding method and apparatus, and a device.

BACKGROUND

In a long term evolution (LTE) system, a physical broadcast channel (PBCH) carries a master information block (MIB). A length of the MIB is 24 bits, and the MIB includes content such as a downlink system bandwidth, a PHICH (Physical Hybrid ARQ Indicator Channel) size, and eight most significant bits of a system frame number (SFN). FIG. 1 shows a processing process of a PBCH at a transmit end. A base station first performs cyclic redundancy check (CRC) coding on a to-be-sent MIB to obtain a 16-bit CRC sequence. Then, the base station performs channel coding and rate matching on a 40-bit sequence (including a 24-bit MIB and a 16-bit CRC) to obtain a coded sequence, segments the coded sequence to obtain four PBCH independent units of an equal size, and scrambles the four PBCH independent units by using four scrambling code sequences respectively. After the scrambling, the base station completes subsequent modulation, mapping, and sending procedures.

Channel coding of the PBCH uses TBCC (tailing bit convolution coding), and the four scrambling code sequences use different phases. The four PBCH independent units carry same coded bits. After procedures such as scrambling, modulation, and mapping are performed, the four PBCH independent units are sent in a time window of 40 ms (transmission time of four radio frames and 10 ms for each radio frame).

FIG. 2 shows a processing process of a PBCH at a receive end. It can be learned from description of the transmit end that the four PBCH independent units carry same coded bits. Therefore, when channel quality is good enough, the receive end receives only one PBCH independent unit in 40 ms to successfully complete operations of descrambling, decoding, and CRC check. Because the receive end successfully descrambles a scrambling code sequence, the receive end learns of a radio frame in which the transmit end sends the MIB in 40 ms, i.e., learns of two least significant bits of the SFN.

When channel quality is relatively poor, if descrambling and decoding of the only one received PBCH independent unit fail, the receive end performs soft combination on the received PBCH independent unit and a PBCH independent unit sent in next 10 ms and performs decoding, until decoding succeeds.

Three major types of scenarios defined in the 5th generation (5G) communications system and more subsequent possible communications systems include: enhanced mobile broadband (eMBB), ultra-reliable low-latency communications (URLLC), and massive machine type communications (mMTC). The eMBB services mainly include an ultra-high-definition video, an augmented reality AR, a virtual reality VR, and the like. The eMBB service is mainly characterized by a large data transmission volume and a high transmission rate. The URLLC service is mainly used for industrial control, unmanned driving, and the like in the Internet of Things. The URLLC service is mainly characterized by ultra-high reliability, a low latency, a smaller data transmission volume, and a burst. The mMTC service is mainly used for a smart grid, a smart city, and the like in the Internet of Things. The mMTC service is mainly characterized by a large quantity of connected devices, a small data transmission volume, and a long latency that can be tolerated.

At the $87^{th}$ meeting of the 3GPP (3rd Generation Partnership Project) RAN (Radio Access Network) 1, a polar polar code is officially accepted as a channel coding scheme for uplink and downlink control channels in the 5G eMBB (enhanced Mobile Broadband) scenario.

When the polar polar code is applied to channel coding of the PBCH, there is still room for improvement.

SUMMARY

This application provides a coding method and apparatus, and a device, so as to improve communication performance of polar coding.

A first aspect of this application provides a coding method, including:

dividing, by a sending device, a subchannel location sequence number set into at least two mutually exclusive subsets based on an interleaving operation, where a subchannel location in each subset still belongs to the subset and does not belong to another subset after any quantity of interleaving operations are performed;

determining, by the sending device, an information bit location set and a frozen bit location set of a to-be-coded polar polar code based on the at least two mutually exclusive subsets; and coding, by the sending device, the to-be-coded polar code based on the information bit location set and the frozen bit location set.

In this solution, the subchannel location in each subset obtained by the sending device based on the interleaving operation still belongs to the subset after any quantity of interleaving operations are performed, and the information bit location set and the frozen bit location set are selected from the foregoing subsets. Therefore, after a polar code is applied to a PBCH, communication performance of polar coding can be further improved. In addition, after the interleaving operation is performed on the polar polar code, a relatively large quantity of redundant versions are obtained, and more information may be implicitly carried.

In one embodiment, the information bit location set and the frozen bit location set are determined based on reliability of the at least two mutually exclusive subsets.

In one embodiment, the reliability of the subset is a minimum value of reliability of subchannels in the subset or an average of reliability of subchannels in the subset.

In this solution, a reliability vector of each subchannel needs to be calculated based on a mother code length according to a rule. The rule may be, for example, a Gaussian approximation (GA)/density evolution (DE) method or a polarity weight (PW) method. After the reliability vector of each subchannel is calculated, the minimum value of the reliability of the subchannels in the subset may be used as the reliability of the subset, or the average of the reliability of the subchannels in the subset may be used as the reliability of the subset.

In one embodiment, the reliability of the subset is a reverse value of a maximum location sequence number in location sequence numbers that are of subchannels in the subset and that are corresponding to a first constructed sequence, and the first constructed sequence is a sequence obtained through sorting in descending order of reliability of subchannels In this solution, a value of the reliability of each subchannel does not need to be calculated, but the reliability of the subset is determined based on only a constructed sequence that is obtained through sorting according to a preset rule. For example, the reverse value of the maximum location sequence number in the location sequence numbers that are of the subchannels in the subset and that are corresponding to the first constructed sequence is used as the reliability value of the subset.

In one embodiment, the reliability of the subset is a maximum location sequence number in location sequence numbers that are of subchannels in the subset and that are corresponding to a second constructed sequence, and the second constructed sequence is a sequence obtained through sorting in ascending order of reliability of subchannels In this solution, the maximum location sequence number in the location sequence numbers that are of the subchannels in the subset and that are corresponding to the second constructed sequence is used as the reliability value of the subset.

In one embodiment, the information bit location set is a set of subchannel location sequence numbers in a subsets selected based on the reliability of the subsets, a total quantity of the subchannel location sequence numbers in the a subsets is equal to a quantity of information bits, a sum of reliability of subchannels in the a subsets is greater than a sum of reliability of subchannels in any one or more other subsets in which a quantity of the subchannels is equal to the quantity of information bits, and a is a positive integer.

In one embodiment, the frozen bit location set is a set of subchannel location sequence numbers other than the information bit location set in the at least two mutually exclusive subsets.

In the foregoing solution, after determining the reliability of the subsets, the sending device selects the subsets based on the reliability of the subsets, and the set of the subchannel location sequence numbers in the a subsets is the information bit location set. In actual application, subsets with highest reliability may be usually selected. A total quantity of subchannel location sequence numbers in the selected a subsets is equal to a quantity of information bits, and a sum of reliability of subchannels in the a subsets is greater than a sum of reliability of subchannels in any one or more other subsets in which a quantity of the subchannels is equal to the quantity of information bits. In this way, it can be ensured that a subchannel in the selected information bit location set is a subchannel with relatively high reliability. After determining the information bit location set, the sending device determines that the frozen bit location set is a set of subchannel location sequence numbers other than the information bit location set from the at least two mutually exclusive subsets obtained through division.

In one embodiment, if the to-be-coded polar code includes a parity check PC bit set, a location set of the PC bit set includes c maximum subchannel sequence numbers selected from c subsets, the c subsets are selected from b subsets, and the b subsets are selected based on the reliability of the subsets, where a total quantity of subchannel sequence numbers in the b subsets is a sum of a quantity of information bits and a quantity of PC bit sets, a sum of reliability of subchannels in the b subsets is greater than a sum of reliability of subchannels in any one or more other subsets in which a quantity of the subchannels is equal to the sum of the quantity of information bits and the quantity of PC bits, a quantity of ones in binary expressions of subchannel sequence numbers in the c subsets is not greater than a quantity of ones in binary expressions of subchannel sequence numbers in the other (b-c) subsets, c is the quantity of PC bits, both b and c are positive integers, and c is not greater than b.

In one embodiment, the information bit location set is a set of subchannel location sequence numbers other than the location set of the PC bit set in the b subsets.

In one embodiment, the frozen bit location set is a set of subchannel location sequence numbers other than the information bit location set and the PC bit location set in the at least two mutually exclusive subsets.

In the foregoing solution, the to-be-coded polar code includes a PC bit set. Therefore, the information bit location set and the location set of the PC bit set may be first determined from the plurality of mutually exclusive subsets, and then the frozen bit location set is determined.

In one embodiment, if the to-be-coded polar code includes a PC bit set, the information bit location set is a set of subchannel location sequence numbers in r subsets selected based on the reliability of the subsets, a total quantity of the subchannel location sequence numbers in the r subsets is equal to a quantity of information bits, and a sum of reliability of subchannels in the r subsets is greater than a sum of reliability of subchannels in any one or more other subsets in which a quantity of the subchannels is equal to the quantity of information bits; a location set of the PC bit set is a set of subchannel location sequence numbers in y subsets that are selected from m subsets other than the r subsets in the at least two mutually exclusive subsets based on the reliability of the subsets, a total quantity of the subchannel location sequence numbers in the y subsets is equal to a quantity of PC bits, and a sum of reliability of subchannels in the y subsets is greater than a sum of reliability of subchannels in any one or more other subsets, in the m subsets, in which a quantity of the subchannels is equal to the quantity of PC bits; and the frozen bit location set is a set of subchannel location sequence numbers other than the information bit location set and the PC bit location set in the at least two mutually exclusive subsets; where r, m, and y are positive integers.

In the foregoing solution, the to-be-coded polar code includes a PC bit set. The sending device may first determine the information bit location set from the plurality of mutually exclusive subsets, then determine the location set of the PC bit set from the remaining subsets, and use a set of subchannel location sequence numbers in the remaining subsets as the frozen bit location set.

In one embodiment, the frozen bit location set is a set of subchannel location sequence numbers in e subsets selected based on the reliability of the subsets, a total quantity of the subchannel location sequence numbers in the e subsets is equal to a quantity of frozen bits, a sum of reliability of subchannels in the e subsets is less than a sum of reliability of subchannels in any one or more other subsets in which a quantity of the subchannels is equal to the quantity of frozen bits, and e is a positive integer.

In the foregoing solution, the sending device may first determine the frozen bit location set, and then use a set of subchannel location sequence numbers in the remaining subsets as the information bit location set and the location set of the PC bit set.

In one embodiment, the information bit location set is a set of subchannel location sequence numbers in g subsets including f subchannel sequence numbers in the first constructed sequence or the second constructed sequence, a total quantity of the subchannel location sequence numbers in the g subsets is equal to a quantity of information bits, and both f and g are positive integers.

In the foregoing solution, the sending device may use, as the information bit location set, the set of subchannel location sequence numbers in the g subsets including the f subchannel sequence numbers in the first constructed sequence or the second constructed sequence. In actual application, because the first constructed sequence is a sequence obtained through sorting in descending order of reliability of subchannels, g subsets including first f subchannel sequence numbers in the first constructed sequence may be selected. However, the second constructed sequence is a sequence obtained through sorting in ascending order of reliability of subchannels, g subsets including last f subchannel sequence numbers in the second constructed sequence may be selected. Certainly, selection may be made according to another rule. For example, g subsets including f subchannel sequence numbers in the first constructed sequence or the second constructed sequence may be discontinuously selected.

In one embodiment, if the to-be-coded polar code includes a PC bit, a PC bit location set includes j maximum subchannel sequence numbers selected from j subsets, and the j subsets are selected from i subsets after a set of subchannel location sequence numbers in the i subsets including h subchannel sequence numbers in the first constructed sequence or the second constructed sequence is determined; where a total quantity of the subchannel sequence numbers in the i subsets is a sum of a quantity of information bits and a quantity of PC bits, a quantity of ones in binary expressions of the subchannel sequence numbers in the j subsets is not greater than a quantity of ones in binary expressions of subchannel sequence numbers in the other (i−j) subsets, j is the quantity of PC bits, h, j are all positive integers, and j is not greater than i.

In one embodiment, the information bit location set is a set of subchannel location sequence numbers other than the PC bit location set in the i subsets; and the frozen bit location set is a set of subchannel location sequence numbers other than the information bit location set and the PC bit location set in the at least two mutually exclusive subsets.

In the foregoing solution, based on the first constructed sequence or the second constructed sequence, the sending device first selects the set of subchannel location sequence numbers in the i subsets including the h subchannel sequence numbers in the first constructed sequence or the second constructed sequence as the information bit location set and the PC bit location set. After the PC bit location set is determined, the set of subchannel location sequence numbers other than the PC bit location set in the i subsets is used as the information bit location set, and a set of remaining subchannel location sequence numbers is used as the frozen bit location set.

In one embodiment, if the to-be-coded polar code includes a PC bit, the information bit location set is a set of subchannel location sequence numbers in n subsets including p subchannel sequence numbers in the first constructed sequence or the second constructed sequence, and a total quantity of the subchannel location sequence numbers in the n subsets is equal to a quantity of information bits; a PC bit location set is a set of subchannel location sequence numbers in C subsets that include B subchannel sequence numbers in the first constructed sequence or the second constructed sequence and that are selected from A subsets other than the n subsets in the at least two mutually exclusive subsets, and a total quantity of the subchannel location sequence numbers in the C subsets is equal to a quantity of PC bits; and the frozen bit is a set of subchannel location sequence numbers other than the information bit location set and the PC bit location set in the at least two mutually exclusive subsets; where p, n, A, B, and C are positive integers.

In the foregoing solution, the sending device separately determines the information bit location set and the PC bit location set. Based on the first constructed sequence or the second constructed sequence, the sending device first selects the set of subchannel location sequence numbers in the n subsets including the p subchannel sequence numbers in the first constructed sequence or the second constructed sequence as the information bit location set. After the n subsets are selected, the set of the subchannel location sequence numbers in the C subsets that include the B subchannel sequence numbers in the first constructed sequence or the second constructed sequence and that are selected from the A subsets other than the n subsets is selected, so that the total quantity of the subchannel location sequence numbers in the C subsets is equal to the quantity of PC bits. There is no overlap between the B subchannel sequence numbers and the p subchannel sequence numbers. Finally, a set of remaining subchannel location sequence numbers is used as the frozen bit location set.

In one embodiment, the frozen bit location set is a set of subchannel location sequence numbers in t subsets including s subchannel sequence numbers in the first constructed sequence or the second constructed sequence, a total quantity of subchannels in the t subsets is equal to a quantity of frozen bits, and both s and t are positive integers.

In the foregoing solution, the sending device may first select the frozen bit location set from the plurality of mutually exclusive subsets, and then determine the information bit location set and the PC bit location set.

In one embodiment, the method further includes:
determining a punctured bit location set when rate matching is required; where the punctured bit location set is a set of subchannel location sequence numbers in w subsets that are selected according to a preset rule from a set of subchannel location sequence numbers other than the information bit location set in the at least two mutually exclusive subsets, and a total quantity of the subchannel location sequence numbers in the w subsets is equal to a quantity of punctured bits; or the punctured bit location set is a set of subchannel location sequence numbers in x subsets that are selected according to a preset rule from a set of subchannel location sequence numbers other than the information bit location set and a PC bit location set in the at least two mutually exclusive subsets, and a total quantity of the subchannel location sequence numbers in the x subsets is equal to a quantity of punctured bits.

In this solution, when a code length M of the to-be-coded polar polar code is not equal to a mother code length N, (N−M) bits need to be punctured. In addition, the preset rule may be selecting one or more subsets from the subsets, may be selecting one or more subsets in order of subchannel sequence numbers, or may be selecting one or more subsets in ascending order of the reliability of the subsets.

In one embodiment, the method further includes:

the coding method is applied to transmission of a physical broadcast channel PBCH in a wireless communications system.

A second aspect of this application provides a coding apparatus, including:

a division module, configured to divide a subchannel location sequence number set into at least two mutually exclusive subsets based on an interleaving operation, where a subchannel location in each subset still belongs to the subset and does not belong to another subset after any quantity of interleaving operations are performed;

a determining module, configured to determine an information bit location set and a frozen bit location set of a to-be-coded polar polar code based on the at least two mutually exclusive subsets; and a coding module, configured to code the to-be-coded polar code based on the information bit location set and the frozen bit location set.

In one embodiment, the information bit location set and the frozen bit location set are determined based on reliability of the at least two mutually exclusive subsets.

In one embodiment, the reliability of the subset is a minimum value of reliability of subchannels in the subset or an average of reliability of subchannels in the subset.

In one embodiment, the reliability of the subset is a reverse value of a maximum location sequence number in location sequence numbers that are of subchannels in the subset and that are corresponding to a first constructed sequence, and the first constructed sequence is a sequence obtained through sorting in descending order of reliability of subchannels In one embodiment, the reliability of the subset is a maximum location sequence number in location sequence numbers that are of subchannels in the subset and that are corresponding to a second constructed sequence, and the second constructed sequence is a sequence obtained through sorting in ascending order of reliability of subchannels In one embodiment, the information bit location set is a set of subchannel location sequence numbers in a subsets selected based on the reliability of the subsets, a total quantity of the subchannel location sequence numbers in the a subsets is equal to a quantity of information bits, a sum of reliability of subchannels in the a subsets is greater than a sum of reliability of subchannels in any one or more other subsets in which a quantity of the subchannels is equal to the quantity of information bits, and a is a positive integer.

In one embodiment, the frozen bit location set is a set of subchannel location sequence numbers other than the information bit location set in the at least two mutually exclusive subsets.

In one embodiment, if the to-be-coded polar code includes a parity check PC bit set, a location set of the PC bit set includes c maximum subchannel sequence numbers selected from c subsets, the c subsets are selected from b subsets, and the b subsets are selected based on the reliability of the subsets, where a total quantity of subchannel sequence numbers in the b subsets is a sum of a quantity of information bits and a quantity of PC bit sets, a sum of reliability of subchannels in the b subsets is greater than a sum of reliability of subchannels in any one or more other subsets in which a quantity of the subchannels is equal to the sum of the quantity of information bits and the quantity of PC bits, a quantity of ones in binary expressions of subchannel sequence numbers in the c subsets is not greater than a quantity of ones in binary expressions of subchannel sequence numbers in the other (b–c) subsets, c is the quantity of PC bits, both b and c are positive integers, and c is not greater than b.

In one embodiment, the information bit location set is a set of subchannel location sequence numbers other than the location set of the PC bit set in the b subsets.

In one embodiment, the frozen bit location set is a set of subchannel location sequence numbers other than the information bit location set and the PC bit location set in the at least two mutually exclusive subsets.

In one embodiment, if the to-be-coded polar code includes a PC bit set, the information bit location set is a set of subchannel location sequence numbers in r subsets selected based on the reliability of the subsets, a total quantity of the subchannel location sequence numbers in the r subsets is equal to a quantity of information bits, and a sum of reliability of subchannels in the r subsets is greater than a sum of reliability of subchannels in any one or more other subsets in which a quantity of the subchannels is equal to the quantity of information bits; a location set of the PC bit set is a set of subchannel location sequence numbers in y subsets that are selected from m subsets other than the r subsets in the at least two mutually exclusive subsets based on the reliability of the subsets, a total quantity of the subchannel location sequence numbers in the y subsets is equal to a quantity of PC bits, and a sum of reliability of subchannels in the y subsets is greater than a sum of reliability of subchannels in any one or more other subsets, in the m subsets, in which a quantity of the subchannels is equal to the quantity of PC bits; and the frozen bit location set is a set of subchannel location sequence numbers other than the information bit location set and the PC bit location set in the at least two mutually exclusive subsets; where r, m, and y are positive integers.

In one embodiment, the frozen bit location set is a set of subchannel location sequence numbers in e subsets selected based on the reliability of the subsets, a total quantity of the subchannel location sequence numbers in the e subsets is equal to a quantity of frozen bits, a sum of reliability of subchannels in the e subsets is less than a sum of reliability of subchannels in any one or more other subsets in which a quantity of the subchannels is equal to the quantity of frozen bits, and e is a positive integer.

In one embodiment, the information bit location set is a set of subchannel location sequence numbers in g subsets including f subchannel sequence numbers in the first constructed sequence or the second constructed sequence, a total quantity of the subchannel location sequence numbers in the g subsets is equal to a quantity of information bits, and both f and g are positive integers.

In one embodiment, if the to-be-coded polar code includes a PC bit, a PC bit location set includes j maximum subchannel sequence numbers selected from j subsets, and the j subsets are selected from i subsets after a set of subchannel location sequence numbers in the i subsets including h subchannel sequence numbers in the first constructed sequence or the second constructed sequence is determined; where a total quantity of the subchannel sequence numbers in the i subsets is a sum of a quantity of information bits and a quantity of PC bits, a quantity of ones in binary expressions of the subchannel sequence numbers in the j subsets is not greater than a quantity of ones in binary expressions of subchannel sequence numbers in the other (i–j) subsets, j is the quantity of PC bits, h, j are all positive integers, and j is not greater than i.

In one embodiment, the information bit location set is a set of subchannel location sequence numbers other than the PC bit location set in the i subsets; and the frozen bit location set is a set of subchannel location sequence numbers other than the information bit location set and the PC bit location set in the at least two mutually exclusive subsets.

In one embodiment, if the to-be-coded polar code includes a PC bit, the information bit location set is a set of subchannel location sequence numbers in n subsets including p subchannel sequence numbers in the first constructed sequence or the second constructed sequence, and a total quantity of the subchannel location sequence numbers in the n subsets is equal to a quantity of information bits; a PC bit location set is a set of subchannel location sequence numbers in C subsets that include B subchannel sequence numbers in the first constructed sequence or the second constructed sequence and that are selected from A subsets other than the n subsets in the at least two mutually exclusive subsets, and a total quantity of the subchannel location sequence numbers in the C subsets is equal to a quantity of PC bits; and the frozen bit is a set of subchannel location sequence numbers other than the information bit location set and the PC bit location set in the at least two mutually exclusive subsets; where p, n, A, B, and C are positive integers.

In one embodiment, the frozen bit location set is a set of subchannel location sequence numbers in t subsets including s subchannel sequence numbers in the first constructed sequence or the second constructed sequence, a total quantity of subchannels in the t subsets is equal to a quantity of frozen bits, and both s and t are positive integers.

In one embodiment, the determining module is further configured to determine a punctured bit location set when rate matching is required; where the punctured bit location set is a set of subchannel location sequence numbers in w subsets that are selected according to a preset rule from a set of subchannel location sequence numbers other than the information bit location set in the at least two mutually exclusive subsets, and a total quantity of the subchannel location sequence numbers in the w subsets is equal to a quantity of punctured bits; or the punctured bit location set is a set of subchannel location sequence numbers in x subsets that are selected according to a preset rule from a set of subchannel location sequence numbers other than the information bit location set and a PC bit location set in the at least two mutually exclusive subsets, and a total quantity of the subchannel location sequence numbers in the x subsets is equal to a quantity of punctured bits.

In one embodiment, the coding apparatus is applied to transmission of a physical broadcast channel PBCH in a wireless communications system.

It should be understood that, in the embodiments of the coding apparatus, the division module, the determining module, and the coding module may be implemented as a processor.

A third aspect of this application provides a sending device, including:

a memory, configured to store a program; and a processor, configured to execute the program stored in the memory. When the program is executed, the processor divides a subchannel location sequence number set into at least two mutually exclusive subsets based on an interleaving operation, where a subchannel location in each subset still belongs to the subset and does not belong to another subset after any quantity of interleaving operations are performed; determines an information bit location set and a frozen bit location set of a to-be-coded polar polar code based on the at least two mutually exclusive subsets; and codes the to-be-coded polar code based on the information bit location set and the frozen bit location set.

In one embodiment, the information bit location set and the frozen bit location set are determined based on reliability of the at least two mutually exclusive subsets.

In one embodiment, the reliability of the subset is a minimum value of reliability of subchannels in the subset or an average of reliability of subchannels in the subset.

In one embodiment, the reliability of the subset is a reverse value of a maximum location sequence number in location sequence numbers that are of subchannels in the subset and that are corresponding to a first constructed sequence, and the first constructed sequence is a sequence obtained through sorting in descending order of reliability of subchannels In one embodiment, the reliability of the subset is a maximum location sequence number in location sequence numbers that are of subchannels in the subset and that are corresponding to a second constructed sequence, and the second constructed sequence is a sequence obtained through sorting in ascending order of reliability of subchannels In one embodiment, the information bit location set is a set of subchannel location sequence numbers in a subsets selected based on the reliability of the subsets, a total quantity of the subchannel location sequence numbers in the a subsets is equal to a quantity of information bits, a sum of reliability of subchannels in the a subsets is greater than a sum of reliability of subchannels in any one or more other subsets in which a quantity of the subchannels is equal to the quantity of information bits, and a is a positive integer.

In one embodiment, the frozen bit location set is a set of subchannel location sequence numbers other than the information bit location set in the at least two mutually exclusive subsets.

In one embodiment, if the to-be-coded polar code includes a parity check PC bit set, a location set of the PC bit set includes c maximum subchannel sequence numbers selected from c subsets, the c subsets are selected from b subsets, and the b subsets are selected based on the reliability of the subsets, where a total quantity of subchannel sequence numbers in the b subsets is a sum of a quantity of information bits and a quantity of PC bit sets, a sum of reliability of subchannels in the b subsets is greater than a sum of reliability of subchannels in any one or more other subsets in which a quantity of the subchannels is equal to the sum of the quantity of information bits and the quantity of PC bits, a quantity of ones in binary expressions of subchannel sequence numbers in the c subsets is not greater than a quantity of ones in binary expressions of subchannel sequence numbers in the other (b−c) subsets, c is the quantity of PC bits, both b and c are positive integers, and c is not greater than b.

In one embodiment, the information bit location set is a set of subchannel location sequence numbers other than the location set of the PC bit set in the b subsets.

In one embodiment, the frozen bit location set is a set of subchannel location sequence numbers other than the information bit location set and the PC bit location set in the at least two mutually exclusive subsets.

In one embodiment, if the to-be-coded polar code includes a PC bit set, the information bit location set is a set of subchannel location sequence numbers in r subsets selected based on the reliability of the subsets, a total quantity of the subchannel location sequence numbers in the r subsets is equal to a quantity of information bits, and a sum of reliability of subchannels in the r subsets is greater than a sum of reliability of subchannels in any one or more other subsets in which a quantity of the subchannels is equal to the quantity of information bits; a location set of the PC bit set is a set of subchannel location sequence numbers in y subsets that are selected from m subsets other than the r subsets in the at least two mutually exclusive subsets based on the reliability of the subsets, a total quantity of the subchannel location sequence numbers in the y subsets is equal to a quantity of PC bits, and a sum of reliability of subchannels in the y subsets is greater than a sum of reliability of subchannels in any one or more other subsets, in the m subsets, in which a quantity of the subchannels is equal to the quantity of PC bits; and the frozen bit location set is a set of subchannel location sequence numbers other than the information bit location set and the PC bit location set in the at least two mutually exclusive subsets; where r, m, and y are positive integers.

In one embodiment, the frozen bit location set is a set of subchannel location sequence numbers in e subsets selected based on the reliability of the subsets, a total quantity of the subchannel location sequence numbers in the e subsets is equal to a quantity of frozen bits, a sum of reliability of subchannels in the e subsets is less than a sum of reliability of subchannels in any one or more other subsets in which a quantity of the subchannels is equal to the quantity of frozen bits, and e is a positive integer.

In one embodiment, the information bit location set is a set of subchannel location sequence numbers in g subsets including f subchannel sequence numbers in the first constructed sequence or the second constructed sequence, a total quantity of the subchannel location sequence numbers in the g subsets is equal to a quantity of information bits, and both f and g are positive integers.

In one embodiment, if the to-be-coded polar code includes a PC bit, a PC bit location set includes j maximum subchannel sequence numbers selected from j subsets, and the j subsets are selected from i subsets after a set of subchannel location sequence numbers in the i subsets including h subchannel sequence numbers in the first constructed sequence or the second constructed sequence is determined; where a total quantity of the subchannel sequence numbers in the i subsets is a sum of a quantity of information bits and a quantity of PC bits, a quantity of ones in binary expressions of the subchannel sequence numbers in the j subsets is not greater than a quantity of ones in binary expressions of subchannel sequence numbers in the other (i−j) subsets, j is the quantity of PC bits, h, i, j are all positive integers, and j is not greater than i.

In one embodiment, the information bit location set is a set of subchannel location sequence numbers other than the PC bit location set in the i subsets; and the frozen bit location set is a set of subchannel location sequence numbers other than the information bit location set and the PC bit location set in the at least two mutually exclusive subsets.

In one embodiment, if the to-be-coded polar code includes a PC bit, the information bit location set is a set of subchannel location sequence numbers in n subsets including p subchannel sequence numbers in the first constructed sequence or the second constructed sequence, and a total quantity of the subchannel location sequence numbers in the n subsets is equal to a quantity of information bits; a PC bit location set is a set of subchannel location sequence numbers in C subsets that include B subchannel sequence numbers in the first constructed sequence or the second constructed sequence and that are selected from A subsets other than the n subsets in the at least two mutually exclusive subsets, and a total quantity of the subchannel location sequence numbers in the C subsets is equal to a quantity of PC bits; and the frozen bit is a set of subchannel location sequence numbers other than the information bit location set and the PC bit location set in the at least two mutually exclusive subsets; where p, n, A, B, and C are positive integers.

In one embodiment, the frozen bit location set is a set of subchannel location sequence numbers in t subsets including s subchannel sequence numbers in the first constructed sequence or the second constructed sequence, a total quantity of subchannels in the t subsets is equal to a quantity of frozen bits, and both s and t are positive integers.

In one embodiment, the processor is further configured to determine a punctured bit location set when rate matching is required; where the punctured bit location set is a set of subchannel location sequence numbers in w subsets that are selected according to a preset rule from a set of subchannel location sequence numbers other than the information bit location set in the at least two mutually exclusive subsets, and a total quantity of the subchannel location sequence numbers in the w subsets is equal to a quantity of punctured bits; or the punctured bit location set is a set of subchannel location sequence numbers in x subsets that are selected according to a preset rule from a set of subchannel location sequence numbers other than the information bit location set and a PC bit location set in the at least two mutually exclusive subsets, and a total quantity of the subchannel location sequence numbers in the x subsets is equal to a quantity of punctured bits.

In one embodiment, the sending device is applied to transmission of a physical broadcast channel PBCH in a wireless communications system.

In the embodiments of the sending device, there is at least one processor configured to execute an execution instruction, in other words, a computer program, stored in the memory. Therefore, the sending device exchanges data with a receiving device through a communications interface, so as to execute the coding method provided in the first aspect. In one embodiment, the memory may be integrated into the processor.

A fourth aspect of this application provides a storage medium, including a readable storage medium and a computer program. The computer program is used to implement the coding method provided in any embodiment of the first aspect.

A fifth aspect of this application provides a program product. The program product includes a computer program (an execution instruction), and the computer program is stored in a readable storage medium. At least one processor of a sending device may read the computer program from the readable storage medium. The at least one processor executes the computer program, so that the sending device implements the coding method provided in the first aspect.

According to the coding method and apparatus, and the device provided in the embodiments of this application, the sending device divides the subchannel location sequence number set into the at least two mutually exclusive subsets based on the interleaving operation, determines the information bit location set and the frozen bit location set of the to-be-coded polar polar code based on the at least two mutually exclusive subsets, and codes the to-be-coded polar code based on the information bit location set and the frozen bit location set. The subchannel location in each subset obtained by the sending device based on the interleaving operation still belongs to the subset after any quantity of interleaving operations are performed, and the information bit location set and the frozen bit location set are selected from the foregoing subsets. Therefore, after a polar code is applied to a PBCH, communication performance of polar coding can be further improved. In addition, after the interleaving operation is performed on the polar polar code, a relatively large quantity of redundant versions are obtained, and more information may be implicitly carried.

BRIEF DESCRIPTION OF DRAWINGS

FIG. 7 is a schematic construction diagram of a PC polar code;
FIG. 8 is a schematic flowchart of a coding method according to an embodiment of this application.

DESCRIPTION OF EMBODIMENTS

The following further describes embodiments of this application in detail with reference to accompanying drawings.

Figure 1:
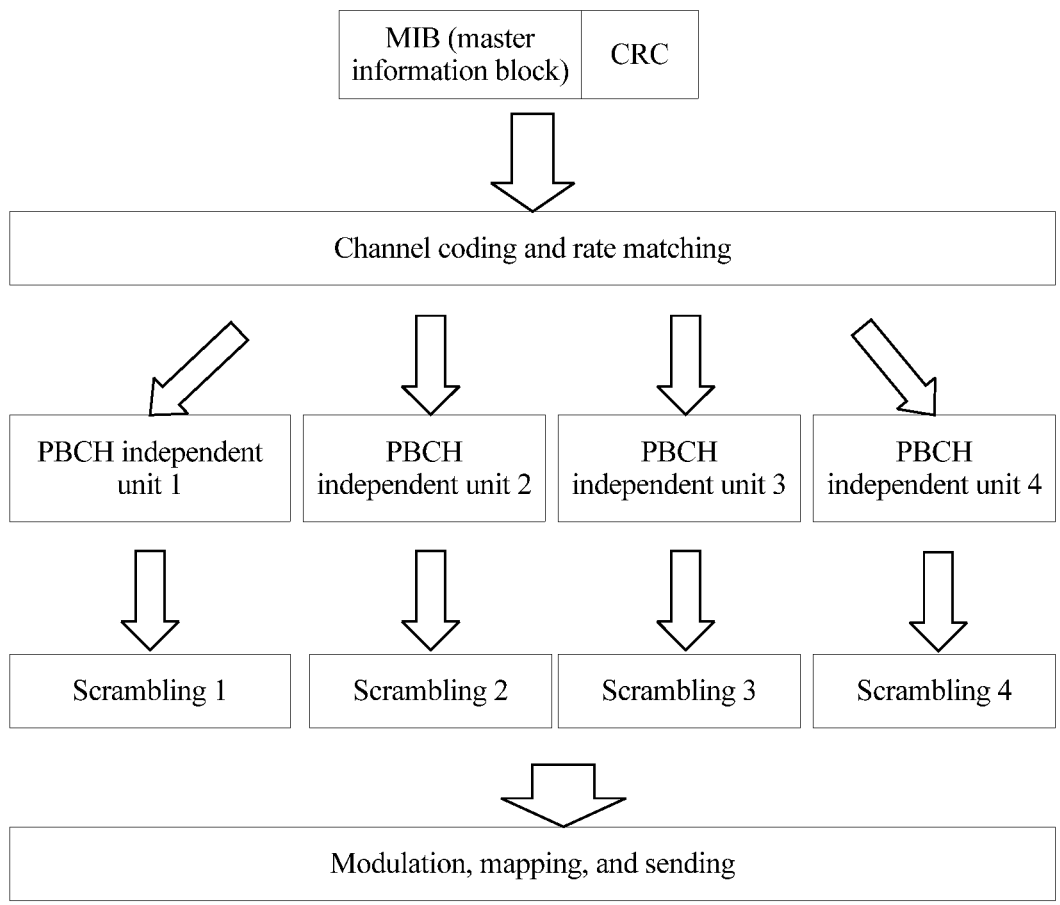
FIG. 1 is a process of processing a PBCH at a transmit end in LTE.
Figure 2:
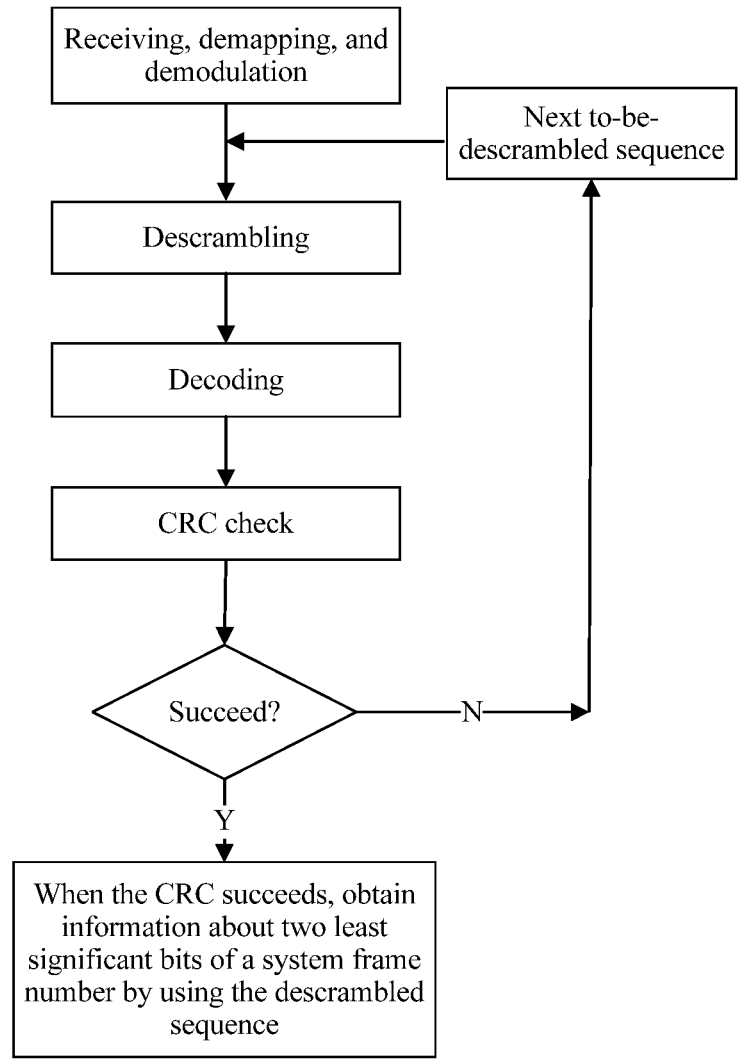
FIG. 2 is a process of processing a PBCH at a receive end in LTE.
Figure 3:
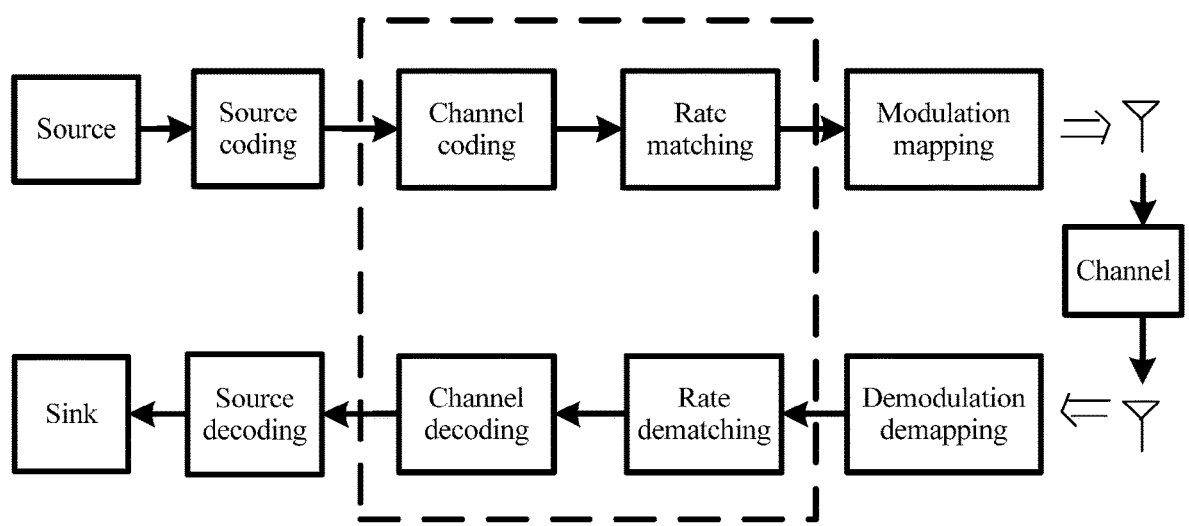
FIG. 3 is a basic flowchart of wireless communication.

FIG. 3 is a basic procedure of wireless communication. At a transmit end, a source is sequentially source coded, channel coded, rate matched, modulation mapped, and then transmitted. At a receive end, a sink is output after demodulating, demapping, rate dematching, channel decoding, and source decoding are sequentially performed. The channel coding or decoding may use a polar code. Because a code length of an original polar code (mother code) is an integer power of 2, a polar code of any code length needs to be implemented by rate matching in actual application. After channel coding, the transmit end performs rate matching to implement any target code length. Before channel decoding, the receive end first performs rate dematching. It should be noted that the basic procedure of the wireless communication further includes additional procedures (for example, precoding and interleaving). These additional procedures are common knowledge to a person skilled in the art and therefore are not listed one by one. A CRC sequence and CRC information mentioned in this application are different names of a same thing.

Figure 4:
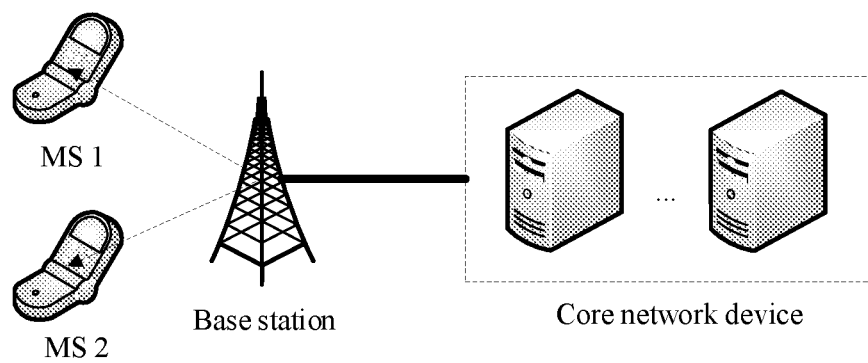
FIG. 4 is an application scenario diagram of an embodiment of this application.

The embodiments of this application may be applied to a wireless communications system. The wireless communications system usually includes a cell. Each cell includes a base station (BS). The base station provides a communications service to a plurality of mobile stations (MS), and the base station is connected to a core network device, as shown in FIG. 4. The base station includes a BBU (Baseband Unit) and an RRU (Remote Radio Unit). The BBU and the RRU may be placed in different places. For example, the RRU is placed in a high-traffic area far away from the BBU in a central equipment room. Alternatively, the BBU and the RRU may be placed in a same equipment room. The BBU and the RRU may be different components in a rack.

It should be noted that the wireless communications system mentioned in the embodiments of this application includes but is not limited to: a narrowband Internet of Things (NB-IoT), a global system for mobile communications (GSM), enhanced data rates for GSM evolution system (EDGE), a wideband code division multiple access (WCDMA) system, a code division multiple access 2000 (CDMA2000) system, a time division-synchronous code division multiple access (TD-SCDMA) system, a long term evolution (LTE) system, and three major application scenarios of a next-generation 5G mobile communications system: eMBB, URLLC, and eMTC.

In the embodiments of this application, the base station is an apparatus deployed in a radio access network to provide a wireless communication function for an MS. The base station may include a macro base station, a micro base station (also referred to as a small cell), a relay station, an access point, and the like in various forms. In systems using different radio access technologies, devices that have a base station function may have different names. For example, in an LTE system, the device is referred to as an evolved NodeB (eNB or eNodeB), and in a 3rd generation (3G) system, the device is referred to as a NodeB (Node B). For ease of description, in all the embodiments of this application, the foregoing apparatuses that provide a wireless communication function for an MS are collectively referred to as a base station or a BS.

The MS mentioned in the embodiments of this application may include various handheld devices, in-vehicle devices, wearable devices, computing devices, or other wireless-modem-connected processing devices that have a wireless communication function. The MS may also be referred to as a terminal, and may further include a subscriber unit, a cellular phone, a smartphone, a wireless data card, a personal digital assistant (PDA) computer, a tablet computer, a wireless modem, a handset, a laptop computer, a machine type communication MTC) terminal, and the like. For ease of description, in all the embodiments of this application, the foregoing mentioned devices are collectively referred to as an MS.

Further, the embodiments of this application may be applied to transmission of a PBCH in a wireless communications system, so that information is implicitly carried.

The following briefly describes the polar code.

In a communications system, channel coding is usually used to improve reliability of data transmission and ensure communication quality. The polar code proposed by Arikan, a Turkish professor, is the first code that is theoretically proven to achieve a Shannon capacity with a low coding or decoding complexity. The polar code is also a linear block code. A coding matrix of the polar code is $G_N$, and a coding process is $x_1^N = u_1^N G_N$, where $u_1^N = (u_1, u_2, \ldots, u_N)$ is a binary row vector with a length N (code length), $G_N$ is a N×N matrix, and $G_N = F_2^{\otimes(\log_2(N))}$. $F_2^{\otimes(\log_2(N))}$ is defined as a Kronecker (Kronecker) product of $\log_2 N$ matrices $F_2$. The foregoing matrix is $$F_2 = \begin{bmatrix} 1 & 0 \\ 1 & 1 \end{bmatrix}.$$

In a coding process of the polar code, some bits in $u_i^N$ are used to carry information and are referred to as an information bit set, and a set of indexes of these bits is denoted as $\mathcal{A}$. Other bits in $u_1^N$ are set to constant values preagreed on between the transmit end and the receive end and are referred to as a constant bit set or a frozen bit set (frozen bits), and a set of indexes of these bits is denoted as a complementary set $\mathcal{A}^c$ of $\mathcal{A}$. The coding process of the polar code is as follows: $x_1^N = u_\mathcal{A} G_N(\mathcal{A}) \oplus u_{\mathcal{A}^c} G_N(\mathcal{A}^c)$, where $G_N(\mathcal{A})$ is a sub-matrix including rows corresponding to the indexes in the set $\mathcal{A}$ in $G_N$, and $G_N(\mathcal{A}^c)$ is a sub-matrix including rows corresponding to the indexes in the set $\mathcal{A}^c$ in $G_N$. $u_\mathcal{A}$ is the information bit set in $u_1^N$, and a quantity of information bits is K. $u_{\mathcal{A}^c}$ is the constant bit set in $u_1^N$, a quantity of constant bits is N−K, and these bits are known bits. These constant bits are usually set to 0, but the constant bit may be set to any value preagreed on between the transmit end and the receive end. Therefore, the coding output of the polar code may be simplified as $x_1^N = u\mathcal{A} G_N(\mathcal{A})$, where $u\mathcal{A}$ is the information bit set in $u_i^N$, and $u\mathcal{A}$ is a row vector with a length K, and in one embodiment, $|\mathcal{A}| = K$, where $|\cdot|$ indicates a quantity of elements in the set, and K is an information block size; and $G_N(\mathcal{A})$ is a sub-matrix including rows corresponding to the indexes in the set $\mathcal{A}$ in the matrix $G_N$, and $G_N(\mathcal{A})$ is a K×N matrix.

A construction process of the polar code is a selection process of the set $\mathcal{A}$, which determines performance of the polar code. The construction process of the polar code is usually as follows: It is determined, based on the mother code length N, that there are N polarized channels in total, corresponding to N rows of the coding matrix respectively. Reliability of the polarized channels is calculated. Indexes of first K polarized channels with relatively high reliability are used as elements of the set $\mathcal{A}$, and indexes corresponding to remaining (N−K) polarized channels are used as elements of the constant bit index set $\mathcal{A}^c$. The set $\mathcal{A}$ determines a location of an information bit, and the set $\mathcal{A}^c$ determines a location of a constant bit.

It can be learned from the coding matrix that, a polar code of any code length needs to be implemented by rate matching in actual application because a code length of an original polar code (mother code) is an integer power of 2.

To improve performance of the polar code, check precoding and then polar coding are usually performed on the information bit set. There are two common check precoding manners: CRC (Cyclic Redundancy Check) concatenated polar coding or PC (Parity Check) concatenated polar coding. Currently, polar coding includes classical Arikan polar coding, CA polar coding, and PC polar coding. According to the polar coding/decoding method and apparatus in this application, classical polar coding, CA polar coding, or PC polar coding may be used.

Figure 5:
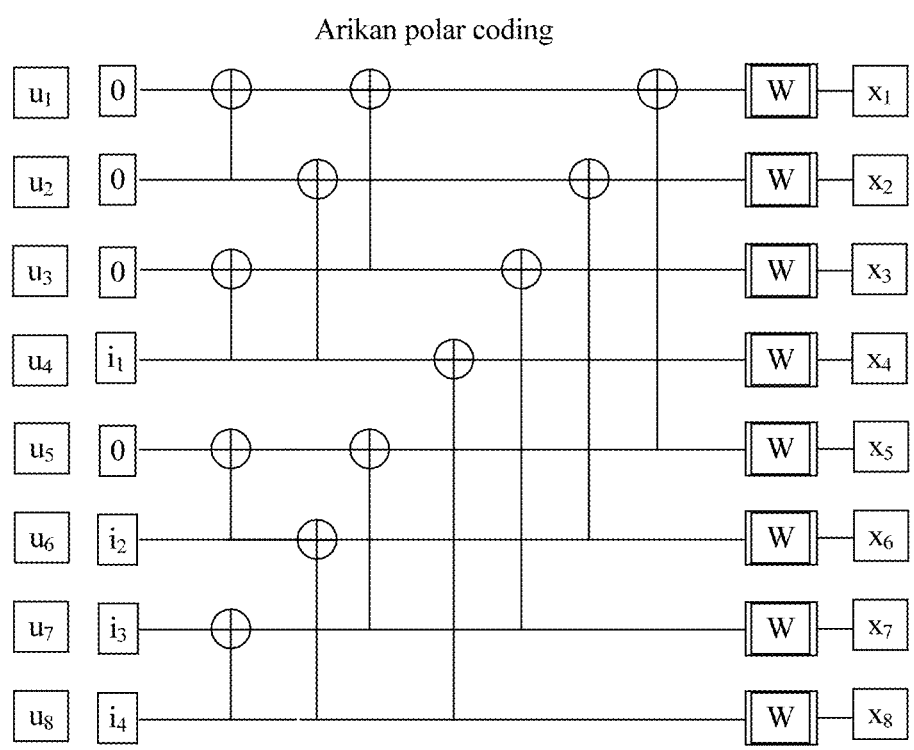
FIG. 5 is a schematic construction diagram of an Arikan polar code.

For description of classical Arikan polar coding in FIG. 5, {u1, u2, u3, u5} is set as a constant bit set, {u4, u6, u7, u8} is set as an information bit set, and four information bits in an information vector with a length of 4 are coded into eight coded bits.

Figure 6:
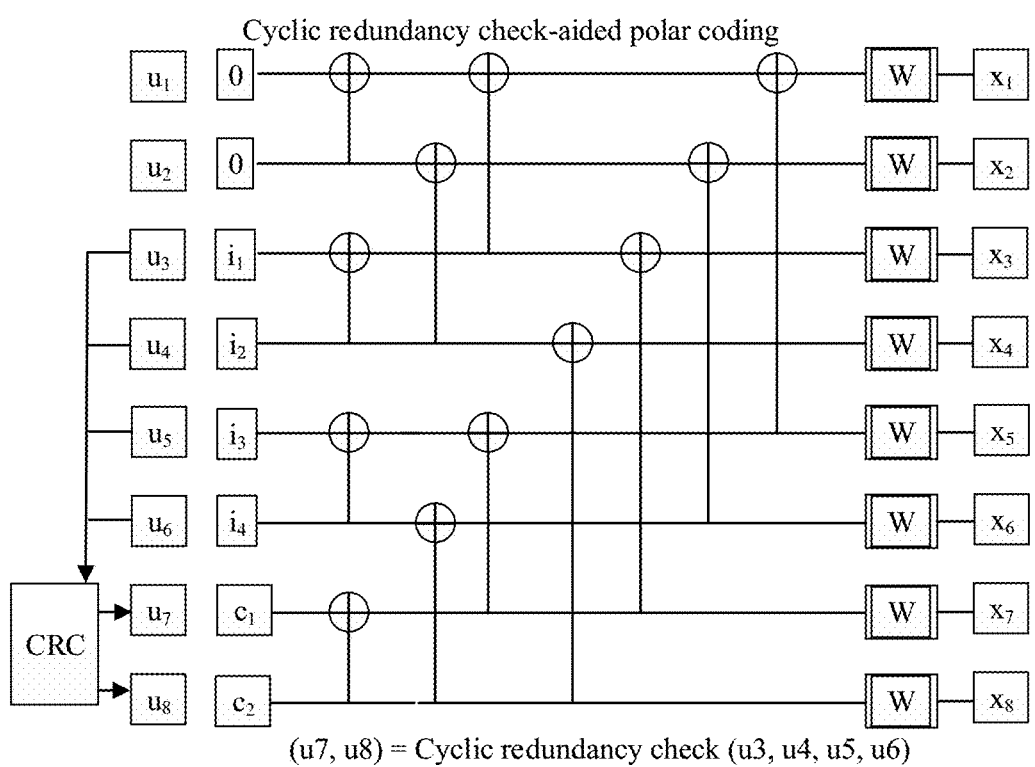
FIG. 6 is a schematic construction diagram of a CA polar code.

For description of CA polar coding in FIG. 6, {u1, u2} is set as a constant bit set, {u3, u4, u5, u6} is set as an information bit set, and {u7, u8} is a CRC bit set. A value of {u7, u8} is obtained by performing CRC on {u3, u4, u5, u6}.

For CA polar coding, a CA-SCL (CRC-Aided Successive Cancellation List) decoding algorithm is used. According to the CA-SCL decoding algorithm, CRC check is used to select, from candidate paths that are output through SCL decoding, a CRC-successful path as a decoding output.

For description of PC polar coding in FIG. 7, {u1, u2, u5} is set as a constant bit set, {u3, u4, u6, u7} is set as an information bit set, and {u7} is a PC constant bit set. A value of {u7} is obtained by performing exclusive OR on {u3, u6}.

The following briefly describes interleaving invariance of the polar code.

When a mother code length N of the polar code is given, a generator matrix of the polar code is an N×N matrix, and the matrix includes $n = \log_2(N)$ base sequences. Rows other than a one-only row in the generator matrix are obtained by mutually performing an AND operation on rows to which the base sequences belong. In addition, interleaving ρ is performed on all N rows by performing interleaving π on the $n = \log_2(N)$ base sequences. Interleaving ρ is cyclic interleaving, and in one embodiment, after interleaving ρ is performed on a given sequence for a plurality of times, the original sequence can be still obtained. Further, it can be found that a row number set {0, 1, 2, 3, . . . , N−1} is divided into a plurality of mutually exclusive subsets (orbit). After interleaving ρ is performed for any quantity of times on a row number indicated by an element in the subset, an obtained row number still belongs to the subset. A quantity of redundant versions generated by performing interleaving π on n sequences is equal to a quantity of redundant versions generated by performing interleaving ρ on N sequences. The quantity of redundant versions is a quantity of accumulated interleaving operations.

N=8 is used as an example for description. The generator matrix of the polar code is an 8×8 matrix.

|   | 7 | 6 | 5 | 4 | 3 | 2 | 1 | 0 |   |   |
|---|---|---|---|---|---|---|---|---|---|---|
| $u_0$ | 1 | 0 | 0 | 0 | 0 | 0 | 0 | 0 | $x_2 x_1 x_0$ | $7 = 111_2$ |
| $u_1$ | 1 | 1 | 0 | 0 | 0 | 0 | 0 | 0 | $x_2 x_1$ | $6 = 110_2$ |
| $u_2$ | 1 | 0 | 1 | 0 | 0 | 0 | 0 | 0 | $x_2 x_0$ | $5 = 101_2$ |
| $u_3$ | 1 | 1 | 1 | 1 | 0 | 0 | 0 | 0 | $x_2$ | $4 = 100_2$ |
| $u_4$ | 1 | 0 | 0 | 0 | 1 | 0 | 0 | 0 | $x_1 x_0$ | $3 = 011_2$ |
| $u_5$ | 1 | 1 | 0 | 0 | 1 | 1 | 0 | 0 | $x_1$ | $2 = 010_2$ |
| $u_6$ | 1 | 0 | 1 | 0 | 1 | 0 | 1 | 0 | $x_0$ | $1 = 001_2$ |
| $u_7$ | 1 | 1 | 1 | 1 | 1 | 1 | 1 | 1 | 1 | $0 = 000_2$ |

As shown above, the fourth, sixth, and seventh rows are base sequences, respectively denoted as x2, x1, and x0, and rows other than the eighth one-only row are obtained by mutually performing an AND operation on the base sequences. For example, the second row is obtained by performing an AND operation on x2 and x1, and is denoted as x2x1. The third row is x2x0. All the rows of the generator matrix are numbered from bottom to top, and the numbering starts from 0, to obtain [7, 6, 5, 4, 3, 2, 1, 0], whose binary representation is [111, 110, 101, 100, 011, 010, 001, 000]. A binary representation of a row number exactly indicates one or more base sequences from which the row is obtained through an AND operation. For example, if a row number 6 has a binary representation 110, it indicates that the row is obtained by performing an AND operation on x2 and x1.

This application provides a coding method. The coding method may be applied to a sending device, for example, a base station in FIG. 4. FIG. 8 is a schematic flowchart of a coding method according to an embodiment of this application. Operations are as follows:

Operation 801: The sending device divides a subchannel location sequence number set into at least two mutually exclusive subsets based on an interleaving operation, where a subchannel location in each subset still belongs to the subset and does not belong to another subset after any quantity of interleaving operations are performed.

In this embodiment, the subchannel location sequence number set is divided into a plurality of mutually exclusive subsets based on the interleaving processing. An element in each subset, and in one embodiment, a location sequence number, still belongs to the subset and does not belong to another subset, regardless of how many times of interleaving operation processing are performed. The interleaving operation is, for example, the foregoing interleaving operation π for the n base sequences or the foregoing interleaving operation ρ for the N sequences. Any two mutually exclusive sets indicate that the two sets do not include any same element. As described above, redundant versions of a plurality of interleaved sequences obtained by performing a plurality of interleaving operations may be used to implicitly carry some information, such as information that is implicitly transmitted on a PBCH or the like.

It should be noted that the polar code in the embodiments of this application has a controllable quantity of redundant versions. In one embodiment, a quantity of redundant versions may be determined according to an application scenario requirement. For example, in a scenario, the polar code needs to carry 3-bit implicit information by using at least eight redundant versions. In this case, when the polar code is initially constructed, an interleaved sequence whose period r is greater than or equal to 8 needs to be selected, and the polar code is constructed based on the interleaved sequence. The "period r" indicates that an original sequence reoccurs after interleaving is performed for r times.

In one embodiment, when an interleaving operation π for a base sequence is given, an interleaving operation ρ is performed on a sequence whose length is $N=2^n$ according to Formula (1):

$$\forall i \in [0, 2^m - 1] \quad \rho(i) = \sum_{j=0}^{m-1} i_{\pi(j)} \cdot 2^j \quad (1)$$

where $(i_{m-1}, i_{m-2}, \ldots, i_0)_2$ is a binary representation of i, a sequence number set $\{0, \ldots, N-1\}$ is divided into a plurality of mutually exclusive subsets $O=\{o_1, o_2, \ldots, o_A\}$ through the interleaving operation ρ, and a sequence number indicated by an element in any subset $o_a$ still belongs to the subset $o_a$ after any quantity of interleaving operations ρ are performed.

In one embodiment, the mutually exclusive subsets may be obtained through division by using the following several methods:

Method 1: If the mother code length is N and the interleaving operation ρ is given, the interleaving operation ρ is performed on a sequence $\{0, 1, 2, \ldots, N-1\}$ for R times, where R is a quantity of redundant versions corresponding to the interleaving operation ρ (and in one embodiment, an original sequence reoccurs after the interleaving operation ρ is performed for R times). Assuming $i_0 \in [0, N-1]$, for $i_0$, after the interleaving operation ρ is performed for the $r^{th}$ time, $i_0$ appears on the $(i_r)^{th}$ bit in the interleaved sequence, where $r \in [1, R]$. Let $o_i = \{\Phi\}$. For r=0, 1, 2, ..., R, if $i_r$ is in $o_i$, no operation is performed; if $i_r$ is not in $o_i$, $i_r$ is put in $o_i$.

Method 2: If the mother code length is N, a subchannel sequence number $j \in [0, N-1]$ is converted into a binary expression whose length is $n=\log_2 N$, a result is denoted as $(i_{j, n-1}, i_{j, n-2}, i_{j, n-3}, \ldots, i_{j, 0})_2$, an interleaving operation π is performed on the result for R times, and an obtained interleaved binary sequence is converted into a decimal sequence number. After binary conversion, the interleaving operation π, and decimal conversion are performed for the $r^{th}$ time, an obtained sequence number is denoted as $j_r$, where $r \in [1, R]$. Let $o_j = \{\Phi\}$. For r=0, 1, 2, ..., R, if $j_r$ is in $o_j$, no operation is performed; if $j_r$ is not in $o_j$, $j_r$ is put in $o_j$. For example, it is assumed that the mother code length is 16, and an interleaving operation π=[3 1 2 4] meets a quantity requirement of redundant versions, and in one embodiment, after interleaving, the third bit of an original sequence becomes the first bit of an interleaved sequence, the first bit of the original sequence becomes the third bit of the interleaved sequence, and the second and fourth bits remain unchanged. The interleaving operation π is performed on a $\log_2(16)=4$-bit binary expression of a subchannel sequence number, to divide a subchannel sequence number set $\{0, 1, 2, \ldots, 15\}$ into subsets. For example, for a subchannel 0, a 4-bit binary expression of the subchannel 0 is 0000. After the interleaving operation π is performed, an obtained binary sequence is still 0000, and a decimal representation of the binary sequence is 0, in other words, $\{0\}$ is a subset. Likewise, for a subchannel 2, a 4-bit binary expression of the subchannel 2 is 0010. After the interleaving operation π is performed, an obtained possible binary sequence is 1000 (the second and fourth bits remain unchanged and the first and third bits are exchanged), and a decimal value of the binary sequence is 8, in other words, $\{2, 8\}$ is a subset. By analogy, a total of 12 subsets $\{0\}$, $\{1\}$, $\{2, 8\}$, $\{3, 9\}$, $\{4\}$, $\{5\}$, $\{6, 12\}$, $\{7, 13\}$, $\{10\}$, $\{11\}$, $\{14\}$, and $\{15\}$ are obtained.

Operation 802: The sending device determines an information bit location set and a frozen bit location set of a to-be-coded polar polar code based on the at least two mutually exclusive subsets.

In this embodiment, after the at least two mutually exclusive subsets are obtained, the information bit location set and the frozen bit location set of the to-be-coded polar polar code are determined based on the foregoing subsets. Any one subset in the information bit location set is different from any one subset in the frozen bit location set. In addition, when rate matching needs to be performed, a punctured bit location set further needs to be determined. A subset in the punctured bit location set is different from a subset in the information bit location set and the frozen bit location set.

Operation 803: The sending device codes the to-be-coded polar code based on the information bit location set and the frozen bit location set.

In this embodiment, the sending device codes the to-be-coded polar code based on the determined information bit location set and frozen bit location set, and sends the coded polar code to a receiving device. The receiving device decodes the coded polar code based on the information bit location set and the frozen bit location set.

According to the coding method provided in this embodiment of this application, the sending device divides the subchannel location sequence number set into the at least two mutually exclusive subsets based on the interleaving operation, determines the information bit location set and the frozen bit location set of the to-be-coded polar polar code based on the at least two mutually exclusive subsets, and codes the to-be-coded polar code based on the information bit location set and the frozen bit location set. The subchannel location in each subset obtained by the sending device based on the interleaving operation still belongs to the subset after any quantity of interleaving operations are performed, and the information bit location set and the frozen bit location set are selected from the foregoing subsets. Therefore, after a polar code is applied to a PBCH, communication performance of polar coding can be further improved. In addition, when the interleaving operation is performed on the polar polar code, information may be implicitly carried.

In one embodiment, the information bit location set and the frozen bit location set are determined based on reliability of the at least two mutually exclusive subsets.

In this embodiment of this application, representations such as a polarity weight, an error probability, and a polarized channel capacity that can describe a relative value of reliability of a polarized channel may be collectively described as reliability. In actual application, the information bit location set and the frozen bit location set may be determined based on reliability of each subset. The reliability of each subset may be determined in the following several manners:

Manner 1: Reliability of a subset is a minimum value of reliability of subchannels in the subset or an average of reliability of subchannels in the subset.

In one embodiment, in this manner, before reliability of each subset is determined, a reliability vector of the subset needs to be calculated based on a mother code length according to a rule. The rule may be, for example, a Gaussian approximation (GA)/density evolution (DE) method or a polarity weight (PW) method. When the GA/DE method is used, the mother code length and a signal-to-noise ratio working point need to be input. When the PW method is used, the mother code length needs to be input.

After the reliability vector of each subchannel is obtained through calculation, a minimum value of the reliability of the subchannels in the subset may be used as the reliability of the subset. For example, a subset $o_a$ includes sequence numbers $i_{a1}, i_{a2}, \ldots, i_{aB}$, and reliability of subchannels corresponding to the sequence numbers is $W(i_{a1})$, $w(i_{a2}), \ldots, W(i_{aB})$ respectively. Therefore, reliability of the subset $o_a$ is $\min(W(i_{a1}), W(i_{a2}), \ldots, W(i_{aB}))$, where $\min(\ )$ represents taking a minimum value. Alternatively, an average of the reliability of the subchannels in the subset may be used as the reliability of the subset. For example, a subset $o_a$ includes sequence numbers $i_{a1}, i_{a2}, \ldots, i_{aB}$, and reliability of subchannels corresponding to the sequence numbers is $W(i_{a1}), w(i_{a2}), \ldots, W(i_{aB})$ respectively. Therefore, reliability of the subset $o_a$ is $\mathrm{mean}(W(i_{a1}), W(i_{a2}), \ldots, W(i_{aB}))$, where $\mathrm{mean}(\ )$ represents taking an average.

Manner 2: Reliability of a subset is a reverse value of a maximum location sequence number in location sequence numbers that are of subchannels in the subset and that are corresponding to a first constructed sequence, and the first constructed sequence is a sequence obtained through sorting in descending order of reliability of subchannels In one embodiment, in some scenarios, a value of reliability of each subchannel may not need to be calculated, but only a constructed sequence obtained after subchannel location sequence numbers are sorted according to a preset rule is provided. The preset rule may be, for example, sorting based on reliability of subchannels or based on quality of subchannels, or may be another preset rule. If the constructed sequence is the first constructed sequence obtained through sorting in descending order of reliability of subchannels, the reliability of the subset is the reverse value of the maximum location sequence number in the location sequence numbers that are of the subchannels in the subset and that are corresponding to the first constructed sequence. For example, if the first constructed sequence is $Q=\{q_1, q_2, \ldots, q_N\}$, and reliability of a subchannel $q_e$ is greater than reliability of a subchannel $q_{e+1}$, a sequence number $z(q_e)$ of $q_e$ in Q is equal to e. If a subset $o_1$ includes subchannel sequence numbers $q_1, q_3, \ldots, q_a$, whose sequence numbers in Q are $z(q_1), z(q_3), \ldots, z(q_a)$, and $z(q_a)$ is largest in the subset $o_1$, reliability of the subset $o_1$ is an inverse value "$-z(qa)$" of the sequence number $z(q_a)$ of a subchannel $q_a$ in the first constructed sequence Q.

Manner 3: Reliability of a subset is a maximum location sequence number in location sequence numbers that are of subchannels in the subset and that are corresponding to a second constructed sequence, and the second constructed sequence is a sequence obtained through sorting in ascending order of reliability of subchannels In one embodiment, similar to Manner 2, in this manner, a value of reliability of each subchannel may not need to be calculated, but only a constructed sequence obtained after subchannel location sequence numbers are sorted according to a preset rule is provided. If the constructed sequence is the second constructed sequence obtained through sorting in ascending order of reliability of subchannels, the reliability of the subset is the maximum location sequence number in the location sequence numbers that are of the subchannels in the subset and that are corresponding to the second constructed sequence. For example, if the second constructed sequence is $Q=\{q_1, q_2, \ldots, q_N\}$, and reliability of a subchannel $q_e$ is less than reliability of a subchannel $q_{e+1}$, a sequence number $z(q_e)$ of $q_e$ in Q is equal to e. If a subset $o_2$ includes sequence numbers $q_2, q_4, \ldots, q_b$, whose sequence numbers in Q are $z(q_2), z(q_4), \ldots, z(q_b)$, and $z(q_b)$ is largest in the subset $o_2$, reliability of the subset $o_2$ is $z(q_b)$.

Based on the foregoing three manners of determining the reliability of the subset, the information bit location set and the frozen bit location set may be selected in the following implementations:

Implementation 1: The information bit location set is a set of subchannel location sequence numbers in a subsets selected based on the reliability of the subsets, a total quantity of the subchannel location sequence numbers in the a subsets is equal to a quantity of information bits, a sum of reliability of subchannels in the a subsets is greater than a sum of reliability of subchannels in any one or more other subsets in which a quantity of the subchannels is equal to the quantity of information bits, and a is a positive integer.

Correspondingly, the frozen bit location set is a set of subchannel location sequence numbers other than the information bit location set in the at least two mutually exclusive subsets.

In one embodiment, after determining the reliability of the subsets in any one of the foregoing manners, the sending device selects the a subsets based on the reliability of the subsets, and the set of the subchannel location sequence numbers in the a subsets is the information bit location set. In actual application, a subsets with highest reliability may be usually selected. A total quantity of subchannel location sequence numbers in the selected a subsets is equal to a quantity of information bits, and a sum of reliability of subchannels in the a subsets is greater than a sum of reliability of subchannels in any one or more other subsets in which a quantity of the subchannels is equal to the quantity of information bits. In this way, it can be ensured that a subchannel in the selected information bit location set is a subchannel with relatively high reliability.

After determining the information bit location set, the sending device determines that the frozen bit location set is a set of subchannel location sequence numbers other than the information bit location set from the at least two mutually exclusive subsets obtained through division.

The following is described by using an example in which the reliability of the subset is determined in Manner 1 and the information bit location set and the frozen bit location set are determined based on the reliability of the subsets. A mother code length N is equal to 16, a quantity K of information bits is equal to 4, and reliability of 16 subchannels is calculated according to a rule. Herein, the polarity weight (PW) method is used as an example, and reliability values of the 16 subchannels are {0, 1, 1.1892, 2.1892, 1.4142, 2.4142, 2.6034, 3.6034, 1.6818, 2.6818, 2.8710, 3.8710, 3.0960, 4.0960, 4.2852, 5.2852} respectively.

It is assumed that an interleaving operation π=[3 1 2 4] meets a quantity requirement of redundant versions, and in one embodiment, after interleaving, the third bit of an original sequence becomes the first bit of an interleaved sequence, the first bit of the original sequence becomes the third bit of the interleaved sequence, and the second and fourth bits remain unchanged. The interleaving operation π is performed on a $\log_2(16)=4$-bit binary expression of a subchannel sequence number, to divide a subchannel sequence number set {0, 1, 2, . . . , 15} into subsets. For example, for a subchannel 0, a 4-bit binary expression of the subchannel 0 is 0000. After the interleaving operation π is performed, an obtained binary sequence is still 0000, and a decimal representation of the binary sequence is 0, in other words, {0} is a subset. Likewise, for a subchannel 2, a 4-bit binary expression of the subchannel 2 is 0010. After the interleaving operation π is performed, an obtained possible binary sequence is 1000 (the second and fourth bits remain unchanged and the first and third bits are exchanged), and a decimal value of the binary sequence is 8, in other words, {2, 8} is a subset. By analogy, a total of 12 subsets {0}, {1}, {2, 8}, {3, 9}, {4}, {5}, {6, 12}, {7, 13}, {10}, {11}, {14}, and {15} are obtained.

After the subsets are obtained through division, reliability of each subset is calculated. For example, reliability of a channel with relatively low reliability in a subset is used as reliability of the subset. Therefore, reliability of the foregoing 12 subsets is {0, 1, 1.1892, 1.6818, 2.1892, 1.4142, 2.4142, 2.6034, 2.6818, 2.8710, 4.0960, 4.2852} respectively. Selection is made from the 12 subsets based on the reliability of the subsets, so that a total quantity of elements included in a selected subset is 4, and a sum of reliability of selected subchannels is largest. To meet this requirement, subchannels included in the four subsets {15}, {14}, {11}, and {10} are selected into the information bit location set, and subchannels included in the remaining subsets form the frozen bit location set.

It should be noted that, in actual application, after the a subsets with relatively high reliability are selected based on the reliability of the subsets, the total quantity of the location sequence numbers in the a subsets may be greater than the quantity of information bits. In this case, all location sequence numbers in one or more subsets with relatively low reliability in the a subsets may be removed, so that a total quantity of selected location sequence numbers is equal to the quantity of information bits. Certainly, the subset may be removed according to another rule, for example, one or more subsets may be removed randomly. A removal manner is not limited in this embodiment.

Implementation 2: The frozen bit location set is a set of subchannel location sequence numbers in e subsets selected based on the reliability of the subsets, a total quantity of the subchannel location sequence numbers in the e subsets is equal to a quantity of frozen bits, a sum of reliability of subchannels in the e subsets is less than a sum of reliability of subchannels in any one or more other subsets in which a quantity of the subchannels is equal to the quantity of frozen bits, and e is a positive integer.

Correspondingly, the information bit location set is a set of subchannel location sequence numbers other than the frozen bit location set in the at least two mutually exclusive subsets.

In one embodiment, in this implementation compared with Implementation 1, the sending device first determines the frozen bit location set based on the reliability of the subsets, and then determines the information bit location set based on the frozen bit location set. After determining the reliability of the subsets in any one of the foregoing manners, the sending device selects the e subsets based on the reliability of the subsets, and the set of the subchannel location sequence numbers in the e subsets is the frozen bit location set. In actual application, e subsets with relatively lowest reliability may be usually selected. A total quantity of subchannel location sequence numbers in the selected e subsets is equal to a quantity of frozen bits, and a sum of reliability of subchannels in the e subsets is less than a sum of reliability of subchannels in any one or more other subsets in which a quantity of the subchannels is equal to the quantity of frozen bits. In this way, it can be ensured that a subchannel in the selected frozen bit location set is a subchannel with relatively low reliability.

After determining the frozen bit location set, the sending device determines that the information bit location set is a set of subchannel location sequence numbers other than the frozen bit location set from the at least two mutually exclusive subsets obtained through division.

The following uses the 12 subsets in Implementation 1 and the reliability of the subsets as an example for description. It is assumed that a quantity L of frozen bits is equal to 12. Selection is made from the 12 subsets based on the reliability of the subsets, so that a total quantity of elements included in a selected subset is 12, and a sum of reliability of selected subchannels is least. To meet this requirement, subchannels included in the eight subsets {0}, {1}, {2, 8}, {3, 9}, {4}, {5}, {6, 12}, and {7, 13} are selected into the frozen bit location set, and subchannels included in the remaining subsets form the information bit location set.

It should be noted that, in actual application, after the e subsets with relatively low reliability are selected based on the reliability of the subsets, the total quantity of the location sequence numbers in the e subsets may be greater than the quantity of frozen bits. In this case, all location sequence numbers in one or more subsets with relatively high reliability in the e subsets may be removed, so that a total quantity of selected location sequence numbers is equal to the quantity of frozen bits. Certainly, removing may be performed according to another rule, for example, one or more subsets may be removed randomly. A removal manner is not limited in this embodiment.

Implementation 3: If the to-be-coded polar code includes a parity check (Parity Check, PC) bit set, a location set of the PC bit set includes c maximum subchannel sequence numbers selected from c subsets, the c subsets are selected from b subsets, and the b subsets are selected based on the reliability of the subsets, where a total quantity of subchannel sequence numbers in the b subsets is a sum of a quantity of information bits and a quantity of PC bits, a sum of reliability of subchannels in the b subsets is greater than a sum of reliability of subchannels in any one or more other subsets in which a quantity of the subchannels is equal to the sum of the quantity of information bits and the quantity of PC bits, a quantity of ones in binary expressions of subchannel sequence numbers in the c subsets is not greater than a quantity of ones in binary expressions of subchannel sequence numbers in the other (b−c) subsets, c is the quantity of PC bits, both b and c are positive integers, and c is not greater than b.

Correspondingly, the information bit location set is a set of subchannel location sequence numbers other than the PC bit location set in the b subsets.

Correspondingly, the frozen bit location set is a set of subchannel location sequence numbers other than the information bit location set and the PC bit location set in the at least two mutually exclusive subsets.

In this embodiment, the to-be-coded polar code includes the PC bit set. Therefore, the information bit location set and the location set of the PC bit set may be first determined from the plurality of mutually exclusive subsets, and then the frozen bit location set is determined. After determining the reliability of the subsets in any one of the foregoing manners, the sending device selects the b subsets from the at least two mutually exclusive subsets based on the reliability of the subsets. In actual application, b subsets with highest reliability may be usually selected, so that a total quantity of subchannel sequence numbers in the b subsets is a sum of a quantity of information bits and a quantity of PC bits, and a sum of reliability of subchannels in the b subsets is greater than a sum of reliability of subchannels in any one or more other subsets in which a quantity of the subchannels is equal to the sum of the quantity of information bits and the quantity of PC bits. In this way, it can be ensured that subchannels in the selected information bit location set and the selected location set of the PC bit set are subchannels with relatively high reliability. After the b subsets are selected, c subsets are selected from the b subsets, so that a quantity of ones in binary expressions of subchannel sequence numbers in the c subsets is not greater than a quantity of ones in binary expressions of subchannel sequence numbers in the other (b−c) subsets, and c maximum subchannel sequence numbers are selected from the c subsets into the location set of the PC bit set.

Because the total quantity of the subchannel sequence numbers in the b subsets is the sum of the quantity of information bits and the quantity of PC bits, after the location set of the PC bit set is determined, and the location set of the PC bit set is removed from the b subsets, a set of remaining subchannel location sequence numbers is the information bit location set. From the plurality of mutually exclusive subsets, the subchannel location sequence number sets in the b subsets are removed, and in one embodiment, the location set of the PC bit set and the information bit location set are removed, and a set of remaining subchannel location sequence numbers is the frozen bit location set.

The following uses the 12 subsets in Implementation 1 and the reliability of the subsets as an example for description. It is assumed that a quantity K of information bits is equal to 4, and a quantity $K_{pc}$ of PC bits is equal to 1. Selection is made from the 12 subsets based on the reliability of the subsets, so that a total quantity of elements included in a selected subset is 5, and a sum of reliability of selected subchannels is largest. To meet this requirement, subchannels included in the four subsets {15}, {14}, {13, 7}, and {11} are selected into the information bit location set and the PC bit location set, and subchannels included in the remaining subsets form the frozen bit location set. In addition, a subset needs to be further selected from the four subsets {15}, {14}, {13, 7}, and {11}, so that a quantity of ones in a binary expression of a subchannel sequence number in the subset is not greater than a quantity of ones in binary expressions of subchannel sequence numbers in the other three subsets. According to the foregoing requirement, the subset {13, 7} may be selected, and a subchannel 13 with a largest sequence number may be selected from the subset to place the PC bit. In this way, the information bit location set is {15, 14, 7, 11}, and subchannels included in the remaining subsets form the frozen bit location set.

It should be noted that in actual application, after the b subsets with relatively high reliability are selected based on the reliability of the subsets, the total quantity of the location sequence numbers in the b subsets may be greater than the sum of the quantity of information bits and the quantity of PC bit sets. In this case, m subsets need to be removed from the b subsets, so that a total quantity of selected location sequence numbers is equal to the sum of the quantity of information bits and the quantity of PC bit sets. A removal method is similar to that in Implementation 1, and details are not described herein again.

Implementation 4: In this implementation compared with Implementation 3, the sending device first determines the frozen bit location set based on the reliability of the subsets, and then determines the information bit location set and a PC bit location set based on the frozen bit location set. In one embodiment, the frozen bit location set is a set of subchannel location sequence numbers in A subsets selected based on the reliability of the subsets, a total quantity of the subchannel location sequence numbers in the A subsets is equal to a quantity of frozen bits, a sum of reliability of subchannels in the A subsets is less than a sum of reliability of subchannels in any one or more other subsets in which a quantity of the subchannels is equal to the quantity of frozen bits, and A is a positive integer.

Correspondingly, the information bit location set and the PC bit location set is a set of subchannel location sequence numbers other than the frozen bit location set in the at least two mutually exclusive subsets.

It should be noted that a manner of determining the frozen bit location set based on the reliability of the subsets is similar to a manner of determining the frozen bit location set in Implementation 2, and details are not described herein again. A manner of determining the information bit location set and the PC bit location set in the remaining subchannels is similar to a manner of determining the information bit location set and the PC bit location set in Implementation 3, and details are not described herein again.

Implementation 5: If the to-be-coded polar code includes a PC bit set, the information bit location set is a set of subchannel location sequence numbers in r subsets selected based on the reliability of the subsets, a total quantity of the subchannel location sequence numbers in the r subsets is equal to a quantity of information bits, and a sum of reliability of subchannels in the r subsets is greater than a sum of reliability of subchannels in any one or more other subsets in which a quantity of the subchannels is equal to the quantity of information bits.

Correspondingly, the location set of the PC bit set is a set of subchannel location sequence numbers in y subsets that are selected from m subsets other than the r subsets in the at least two mutually exclusive subsets based on the reliability of the subsets. A total quantity of subchannel location sequence numbers in the y subsets is equal to a quantity of PC bits, and a sum of reliability of subchannels in the y subsets is greater than a sum of reliability of any one or more other subsets, in the m subsets, in which a quantity of subchannels is equal to the quantity of PC bits. Herein, r, m, y are positive integers.

Correspondingly, the frozen bit location set is a set of subchannel location sequence numbers other than the information bit location set and the PC bit location set in the at least two mutually exclusive subsets.

In one embodiment, in this implementation compared with Implementation 3 and Implementation 4, the information bit location set and the PC bit location set are separately determined. After determining the reliability of the subsets in any one of the foregoing manners, the sending device selects the r subsets based on the reliability of the subsets, and the set of the subchannel location sequence numbers in the r subsets is the information bit location set. In actual application, r subsets with highest reliability may be usually selected. A total quantity of subchannel location sequence numbers in the selected r subsets is equal to a quantity of information bits, and a sum of reliability of subchannels in the r subsets is greater than a sum of reliability of subchannels in any one or more other subsets in which a quantity of the subchannels is equal to the quantity of information bits. In this way, it can be ensured that a subchannel in the selected information bit location set is a subchannel with relatively high reliability.

After determining the information bit location set, the sending device selects the PC bit location set from the remaining subsets, and selects the y subsets from the m subsets other than the r subsets, so that the total quantity of subchannel location sequence numbers in the y subsets is equal to the quantity of PC bits, and the sum of reliability of subchannels in they subsets is greater than the sum of the reliability of the subchannels in the any one or more other subsets, in the m subsets, in which the quantity of the subchannels is equal to the quantity of PC bits. Finally, a set of remaining subchannels is used as the frozen bit location set.

The following uses the 12 subsets in Implementation 1 and the reliability of the subsets as an example for description. It is assumed that a quantity K of information bits is equal to 4 and a quantity $K_{pc}$ of PC bits is equal to 2. Selection is made from the 12 subsets based on the reliability of the subsets, so that a total quantity of elements included in a selected subset is 4, and a sum of reliability of selected subchannels is largest. To meet this requirement, subchannels included in the four subsets {15}, {14}, {11}, and {10} are selected into the information bit location set. After the information bit location set is determined, the PC bit location set is selected from the remaining subsets. In actual application, a subset with relatively high reliability is usually selected from the remaining subsets to determine the PC bit location set. For example, {13, 7} is selected. Because $K_{pc}=2$, the subchannels 7 and 13 in the subset are used to place the PC bits. In addition, subchannels included in the remaining subsets form the frozen bit location set.

It should be noted that in actual application, after the r subsets with relatively high reliability are selected based on the reliability of the subsets, the total quantity of the location sequence numbers in the r subsets may be greater than the quantity of information bits. In this case, m subsets need to be removed from the r subsets, so that a total quantity of selected location sequence numbers is equal to the quantity of information bits. A removal method is similar to that in implementation 1, and details are not described herein again. In addition, if the total quantity of the selected location sequence numbers in the y subsets is greater than the quantity of PC bits, one or more subsets need to be removed as well, so that a total quantity of selected location sequence numbers is equal to the quantity of PC bits.

In one embodiment, the frozen bit location set may be selected first based on the reliability of the subsets, then the PC bit location set is selected, and finally, a set of remaining subchannel location sequence numbers is used as the information bit location set. A determining manner is similar to the determining manner in Implementation 2 and Implementation 4, and details are not described herein again.

Implementation 6: The information bit location set is a set of subchannel location sequence numbers in g subsets including f subchannel sequence numbers in the first constructed sequence or the second constructed sequence, a total quantity of the subchannel location sequence numbers in the g subsets is equal to a quantity of information bits, and both f and g are positive integers.

Correspondingly, the frozen bit location set is a set of subchannel location sequence numbers other than the information bit location set in the at least two mutually exclusive subsets.

In one embodiment, the sending device may use, as the information bit location set, the set of subchannel location sequence numbers in the g subsets including the f subchannel sequence numbers in the first constructed sequence or the second constructed sequence. In actual application, because the first constructed sequence is a sequence obtained through sorting in descending order of reliability of subchannels, g subsets including first f subchannel sequence numbers in the first constructed sequence may be selected. However, the second constructed sequence is a sequence obtained through sorting in ascending order of reliability of subchannels, g subsets including last f subchannel sequence numbers in the second constructed sequence may be selected. Certainly, selection may be made according to another rule. For example, g subsets including f subchannel sequence numbers in the first constructed sequence or the second constructed sequence may be discontinuously selected.

The first constructed sequence is used as an example. In one embodiment process, it is assumed that the information bit location set is initialized as an empty set IPC={φ}. According to a sequence in the first constructed sequence Q, the following operations are performed on sequence numbers $q_1, q_2, \ldots, q_N$. If $q_e$ is in the IPC, $q_{e+1}$ is continuously processed. If $q_e$ is not in the IPC, a subset $o_{qe}$ including the sequence number $q_e$ is found in mutually exclusive subsets $O=\{o_1, o_2, \ldots o_a\}$, and elements in $o_{qe}$ are put into the set IPC until a quantity of elements in the IPC is greater than or equal to the quantity of information bits.

The following is described by using an example in which a mother code length N is equal to 16, a quantity K of information bits is equal to 4, and a first constructed sequence Q={15 14 13 11 7 12 10 9 6 5 3 8 4 2 1 0}. Reliability of subchannels in the first constructed sequence is arranged in descending order.

It is assumed that an interleaving operation π=[3 1 2 4] meets a quantity requirement of redundant versions, and in one embodiment, after interleaving, the third bit of an original sequence becomes the first bit of an interleaved sequence, the first bit of the original sequence becomes the third bit of the interleaved sequence, and the second and fourth bits remain unchanged. The interleaving operation π is performed on a $\log_2(16)=4$-bit binary expression of a subchannel sequence number, to divide a subchannel sequence number set {0, 1, 2, . . . , 15} into subsets. For example, for a subchannel 0, a 4-bit binary expression of the subchannel 0 is 0000. After the interleaving operation π is performed, an obtained binary sequence is still 0000, and a decimal representation of the binary sequence is 0, in other words, {0} is a subset. Likewise, for a subchannel 2, a 4-bit binary expression of the subchannel 2 is 0010. After the interleaving operation π is performed, an obtained possible binary sequence is 1000 (the second and fourth bits remain unchanged and the first and third bits are exchanged), and a decimal value of the binary sequence is 8, in other words, {2, 8} is a subset. By analogy, a total of 12 subsets {0}, {1}, {2, 8}, {3, 9}, {4}, {5}, {6, 12}, {7, 13}, {10}, {11}, {14}, and {15} are obtained.

According to the sequence of subchannels in Q, subchannels in a set of subchannel location sequence numbers in the subsets including 15, 14, and 13, namely, I={15 14 13 7}, and in one embodiment, in the three subsets {15}, {14}, and {7, 13}, are selected to place the information bits, and the remaining subchannels are used to place the frozen bits.

It should be noted that, in actual application, after the g subsets are selected, the total quantity of the location sequence numbers in the g subsets may be greater than the quantity of information bits. In this case, m subsets with relatively large location sequence numbers in the first constructed sequence may be removed from the g subsets, so that a total quantity of selected location sequence numbers is equal to the quantity of information bits; or m subsets with relatively small location sequence numbers in the second constructed sequence may be removed from the g subsets, so that a total quantity of selected location sequence numbers is equal to the quantity of information bits. Certainly, removal may be performed according to another rule, for example, the m subsets may be removed randomly. A removal manner is not limited in this embodiment.

It should be noted that, a set of subchannel location sequence numbers in t subsets including s subchannel sequence numbers in the first constructed sequence or the second constructed sequence may be first selected as the frozen bit location set, and a set of remaining subchannel locations is used as the information bit location set. In actual application, because the first constructed sequence is a sequence obtained through sorting in descending order of reliability of subchannels, t subsets including last s subchannel sequence numbers in the first constructed sequence may be selected. However, the second constructed sequence is a sequence obtained through sorting in ascending order of reliability of subchannels, t subsets including first s subchannel sequence numbers in the second constructed sequence may be selected. Certainly, selection may be made according to another rule. For example, t subsets including s subchannel sequence numbers in the first constructed sequence or the second constructed sequence may be discontinuously selected.

Implementation 7: If the to-be-coded polar code includes a PC bit, a PC bit location set includes j maximum subchannel sequence numbers selected from j subsets, and the j subsets are selected from i subsets after a set of subchannel location sequence numbers in the i subsets including h subchannel sequence numbers in the first constructed sequence or the second constructed sequence is determined; where a total quantity of the subchannel sequence numbers in the i subsets is a sum of a quantity of information bits and a quantity of PC bits, a quantity of ones in binary expressions of the subchannel sequence numbers in the j subsets is not greater than a quantity of ones in binary expressions of subchannel sequence numbers in the other (i−j) subsets, j is the quantity of PC bits, h, j are all positive integers, and j is not greater than i.

Correspondingly, the information bit location set is a set of subchannel location sequence numbers other than the PC bit location set in the i subsets.

Correspondingly, the frozen bit location set is a set of subchannel location sequence numbers other than the information bit location set and the PC bit location set in the at least two mutually exclusive subsets.

In one embodiment, based on the first constructed sequence or the second constructed sequence, the sending device first selects the set of subchannel location sequence numbers in the i subsets including the h subchannel sequence numbers in the first constructed sequence or the second constructed sequence as the information bit location set and the PC bit location set. In actual application, because the first constructed sequence is a sequence obtained through sorting in descending order of reliability of subchannels, i subsets including first h subchannel sequence numbers in the first constructed sequence may be selected. However, the second constructed sequence is a sequence obtained through sorting in ascending order of reliability of subchannels, i subsets including last h subchannel sequence numbers in the second constructed sequence may be selected. Certainly, selection may be made according to another rule. For example, i subsets including h subchannel sequence numbers in the first constructed sequence or the second constructed sequence may be discontinuously selected. After the i subsets are selected, j subsets are selected from the i subsets, so that a quantity of ones in binary expressions of subchannel sequence numbers in the j subsets is not greater than a quantity of ones in binary expressions of subchannel sequence numbers in the other (i−j) subsets, and j maximum subchannel sequence numbers are selected from the j subsets into the PC bit location set.

After the PC bit location set is determined, the set of subchannel location sequence numbers other than the PC bit location set in the i subsets is used as the information bit location set, and a set of remaining subchannel location sequence numbers is used as the frozen bit location set.

The following is described by using an example in which a mother code length N is equal to 16, a quantity K of information bits is equal to 4, $K_{pc}=1$, and a first constructed sequence Q={15 14 13 11 7 12 10 9 6 5 3 8 4 2 1 0}. Based on an interleaving operation, a total of 12 subsets {0}, {1}, {2, 8}, {3, 9}, {4}, {5}, {6, 12}, {7, 13}, {10}, {11}, {14}, and {15} are obtained.

According to a sequence of subchannels in Q, subchannels in a set of subchannel location sequence numbers in the subsets including 15, 14, 13, and 11, namely, I={15 14 13 7 11}, and in one embodiment, in the four subsets {15}, {14}, {7, 13}, and {11}, are selected to place the information bit and the PC bit. In addition, a subset needs to be selected from the four subsets {15}, {14}, {13, 7}, and {11}, so that the subset meets a requirement that a quantity of ones in a binary expression of a subchannel sequence number in the subset is not greater than a quantity of ones in binary expressions of subchannel sequence numbers in the other three subsets. According to the foregoing requirement, the subset {13, 7} may be selected, and then the subchannel 13 with a maximum sequence number is selected from the subset to place the PC bit. In this way, the information bit location set is {15, 14, 7, 11}, and subchannels included in the remaining subsets form the frozen bit location set.

It should be noted that, in actual application, after the i subsets are selected, the total quantity of the location sequence numbers in the i subsets may be greater than the sum of the quantity of information bits and the quantity of PC bits. In this case, m subsets with relatively large location sequence numbers in the first constructed sequence may be removed from the i subsets, so that a total quantity of selected location sequence numbers is equal to the sum of the quantity of information bits and the quantity of PC bits; or m subsets with relatively small location sequence numbers in the second constructed sequence may be removed from the i subsets, so that a total quantity of selected location sequence numbers is equal to the sum of the quantity of information bits and the quantity of PC bits. Certainly, removal may be performed according to another rule, for example, the m subsets may be removed randomly. A removal manner is not limited in this embodiment.

It should be noted that, a set of subchannel location sequence numbers in t subsets including s subchannel sequence numbers in the first constructed sequence or the second constructed sequence may be first selected as the frozen bit location set, and a set of remaining subchannel locations is used as the information bit location set and the PC bit location set. In actual application, because the first constructed sequence is a sequence obtained through sorting in descending order of reliability of subchannels, t subsets including last s subchannel sequence numbers in the first constructed sequence may be selected. However, the second constructed sequence is a sequence obtained through sorting in ascending order of reliability of subchannels, t subsets including first s subchannel sequence numbers in the second constructed sequence may be selected. Certainly, selection may be made according to another rule. For example, t subsets including s subchannel sequence numbers in the first constructed sequence or the second constructed sequence may be discontinuously selected. A manner of determining the information bit location set and the PC bit location set in the remaining subset is similar to the manner in Implementation 7, and details are not described herein again.

Implementation 8: If the to-be-coded polar code includes a PC bit, the information bit location set is a set of subchannel location sequence numbers in n subsets include p subchannel sequence numbers in the first constructed sequence or the second constructed sequence, and a total quantity of subchannel location sequence numbers in the n subsets is equal to a quantity of information bits.

Correspondingly, a PC bit location set is a set of subchannel location sequence numbers in C subsets that include B subchannel sequence numbers in the first constructed sequence or the second constructed sequence and that are selected from A subsets other than the n subsets in the at least two mutually exclusive subsets, and a total quantity of subchannel location sequence numbers in the C subsets is equal to a quantity of PC bits. Herein, p, n, A, B, and C are positive integers.

Correspondingly, the frozen bit is a set of subchannel location sequence numbers other than the information bit location set and the PC bit location set in the at least two mutually exclusive subsets.

In one embodiment, in this implementation compared with Implementation 7, the sending device separately determines the information bit location set and the PC bit location set. Based on the first constructed sequence or the second constructed sequence, the sending device first selects the set of subchannel location sequence numbers in the n subsets including the p subchannel sequence numbers in the first constructed sequence or the second constructed sequence as the information bit location set. In actual application, because the first constructed sequence is a sequence obtained through sorting in descending order of reliability of subchannels, n subsets including first p subchannel sequence numbers in the first constructed sequence may be selected. However, the second constructed sequence is a sequence obtained through sorting in ascending order of reliability of subchannels, n subsets including last p subchannel sequence numbers in the second constructed sequence may be selected. Certainly, selection may be made according to another rule. For example, n subsets including p subchannel sequence numbers in the first constructed sequence or the second constructed sequence may be discontinuously selected. After the n subsets are selected, the set of the subchannel location sequence numbers in the C subsets that include the B subchannel sequence numbers in the first constructed sequence or the second constructed sequence and that are selected from the A subsets other than the n subsets is selected, so that the total quantity of the subchannel location sequence numbers in the C subsets is equal to the quantity of PC bits. There is no overlap between the B subchannel sequence numbers and the p subchannel sequence numbers. Finally, a set of remaining subchannel location sequence numbers is used as the frozen bit location set.

The following is described by using an example in which a mother code length N is equal to 16, a quantity K of information bits is equal to 4, $K_{pc}$=1, and a first constructed sequence Q={15 14 13 11 7 12 10 9 6 5 3 8 4 2 1 0}. Based on an interleaving operation, a total of 12 subsets {0}, {1}, {2, 8}, {3, 9}, {4}, {5}, {6, 12}, {7, 13}, {10}, {11}, {14}, and {15} are obtained.

According to a sequence of subchannels in Q, subchannels in a set of subchannel location sequence numbers in the subsets including 15, 14, and 13, namely, I={15 14 13 7}, and in one embodiment, in the three subsets {15}, {14}, and {7, 13}, are selected to place the information bits. According to the sequence of the subchannels in Q, subchannels in a set of subchannel location sequence numbers in the subset including 11, namely, in the subset I={11}, are selected from the remaining subsets to place the PC bits. Finally, subchannels in the remaining subsets form the frozen bit location set.

It should be noted that, alternatively, a set of subchannel location sequence numbers in N subsets including M subchannel sequence numbers in the first constructed sequence or the second constructed sequence may be first selected as the frozen bit location set, and then a set of subchannel location sequence numbers in Q subsets including P subchannel sequence numbers in the first constructed sequence or the second constructed sequence is selected from the remaining subsets as the frozen bit location set. The M subchannel sequence numbers do not overlap the P subchannel sequence numbers. Finally, a set of remaining subchannel locations is used as the information bit location set. In actual application, because the first constructed sequence is a sequence obtained through sorting in descending order of reliability of subchannels, N subsets including last M subchannel sequence numbers in the first constructed sequence may be selected as the frozen bit location set, and in the remaining subsets, Q subsets including last P subchannel sequence numbers other than the M subchannel sequence numbers in the first constructed sequence are still selected as the PC bit location set. However, because the second constructed sequence is a sequence obtained through sorting in ascending order of reliability of subchannels, N subsets including first M subchannel sequence numbers in the second constructed sequence may be selected as the frozen bit location set, and in the remaining subsets, Q subsets including first P subchannel sequence numbers other than the M subchannel sequence numbers in the second constructed sequence are still selected as the PC bit location set. Certainly, selection may be made according to another rule. For example, N subsets including M subchannel sequence numbers in the first constructed sequence or the second constructed sequence are discontinuously selected as the frozen bit location set, and Q subsets including P subchannel sequence numbers in the first constructed sequence or the second constructed sequence are discontinuously selected as the PC bit location set.

Implementation 9: A punctured bit location set is determined when rate matching is required. The punctured bit location set is a set of subchannel location sequence numbers in w subsets that are selected according to a preset rule from a set of subchannel location sequence numbers other than the information bit location set in the at least two mutually exclusive subsets, and a total quantity of the subchannel location sequence numbers in the w subsets is equal to a quantity of punctured bits; or the punctured bit location set is a set of subchannel location sequence numbers in x subsets that are selected according to a preset rule from a set of subchannel location sequence numbers other than the information bit location set and a PC bit location set in the at least two mutually exclusive subsets, and a total quantity of the subchannel location sequence numbers in the x subsets is equal to a quantity of punctured bits.

In one embodiment, when a code length M of the to-be-coded polar polar code is not equal to a mother code length N, (N−M) bits need to be punctured. If the to-be-coded polar polar code does not include a PC bit, the punctured bit location set is a set of subchannel location sequence numbers in w subsets that are selected according to a preset rule from a set of subchannel location sequence numbers other than the information bit location set in the at least two mutually exclusive subsets, and a total quantity of the subchannel location sequence numbers in the w subsets is equal to a quantity of punctured bits. If the to-be-coded polar polar code includes a PC bit, the punctured bit location set is a set of subchannel location sequence numbers in x subsets that are selected according to a preset rule from a set of subchannel location sequence numbers other than the information bit location set and a PC bit location set in the at least two mutually exclusive subsets, and a total quantity of the subchannel location sequence numbers in the x subsets is equal to a quantity of punctured bits. The preset rule may be selecting any one or more subsets from the subsets, or may be selecting one or more subsets in order of subchannel sequence numbers, or may be selecting one or more subsets in ascending order of reliability of subsets. A form of the preset rule is not limited in this embodiment.

In addition, the information bit location set, the PC bit location set, and the frozen bit location set may be determined by using any one of Implementation 1 to Implementation 8. Details are not described herein again.

The following is described by using an example in which a mother code length N is equal to 16, a code length M is equal to 14, and a quantity K of information bits is equal to 4. Because the code length M is not equal to the mother code length N, 16−14=2 bits need to be punctured. Based on an interleaving operation, a total of 12 subsets {0}, {1}, {2, 8}, {3, 9}, {4}, {5}, {6, 12}, {7, 13}, {10}, {11}, {14}, and {15} are obtained. If it is determined, based on any one of the foregoing implementations, that the information bit location set is {10}, {11}, {14}, and {15}, one or more subsets are selected from the remaining subsets, so that a quantity of subchannels included in the one or more subsets is 2. If a rule for selecting a punctured bit is puncturing in a location with relatively low reliability, the punctured bit location set may be {0} and {1}. In addition, if it is determined, based on any one of the foregoing implementations, that a location set of 12 frozen bits is {0}, {1}, {2, 8}, {3, 9}, {4}, {5}, {6, 12}, and {7, 13}, one or more subsets are selected from the location set, so that a quantity of subchannels included in the one or more subsets is 2. If a rule for selecting a punctured bit is puncturing in a location with relatively low reliability, the punctured bit location set may be {0} and {1}.

In one embodiment, after the information bit location set and the PC bit location set are determined by using the foregoing implementations, if the information bit location set and the PC bit location set are $O_{IPC}=\{o_{IPC1}, o_{IPC2}, o_{IPC3}, \ldots, o_{IPCC}\}$, PC bit locations include $K_{pc}$ subchannels with largest subchannel sequence numbers in $K_{pc}$ subsets in these subsets. A method for determining a check equation is as follows: For each PC bit, the PC bit is used to check information bits on all other subchannels in a same subset.

Figure 9:
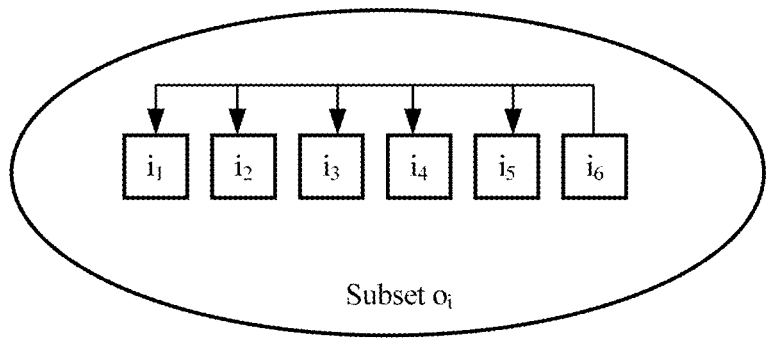
FIG. 9 is a schematic diagram of a check relationship.

FIG. 9 is a schematic diagram of a check relationship. As shown in FIG. 9, a subset $o_i$ including six elements is a subset of a set $O_{IPC}$, and a subchannel $i_6$ with a largest sequence number is selected to place a PC bit, so that the PC bit is used to check information bits on the other five subchannels.

For example, if the determined information bit location set and the determined PC bit location set are {15}, {14}, {13, 7}, {11}, and {10}, a subset is selected from the five sets so that a quantity of ones in a binary expression of a subchannel sequence number in this subset is not greater than a quantity of ones in binary expressions of subchannel sequence numbers in the other four subsets, and a subchannel with a largest sequence number is selected from the subset to place the PC bit. In this example, the subchannel 13 is selected to place the PC bit, so as to check an information bit on the subchannel 7.

In one embodiment, after the information bit location set, the PC bit location set, and the frozen bit location set are determined by using the foregoing implementations, it is assumed that the PC bit location set is $PC=\{o_{pc1}, o_{pc2}, \ldots, o_{pcJ}\}$, in other words, the PC bit location set includes J foregoing subsets, and it is assumed that the information bit location set is $O_I=\{o_{I1}, o_{I2}, o_{I3}, \ldots, o_{IC}\}$. Therefore, the method for determining the check equation is as follows: PC bits on all subchannels in $o_{pcj}$ (1≤j≤J) are used to check information bits on all subchannels in one or more subsets constituting $O_I$.

In addition, the manner of determining the PC equation in FIG. 9 is used to determine a PC bit location in Implementation 3 and Implementation 7.

Figure 10:
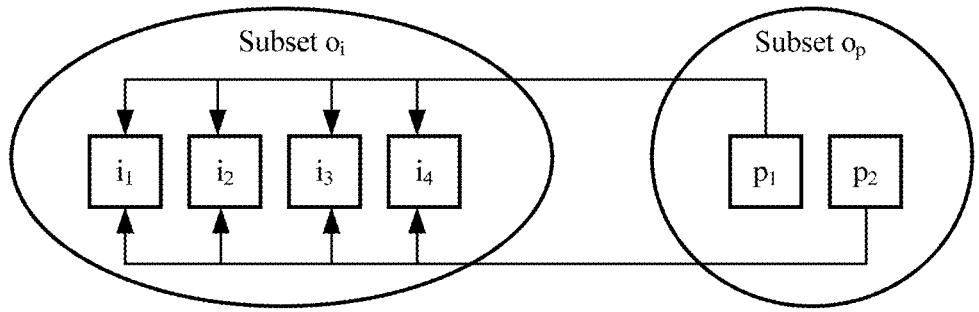
FIG. 10 is another schematic diagram of a check relationship.

FIG. 10 is another schematic diagram of a check relationship. As shown in FIG. 10, all subchannels in a subset $o_i$ including four elements are information bit locations, and two subchannels in a subset $o_p$ are used to place the PC bits, so that both the PC bits on $p_1$ and $p_2$ are used to check $i_1$ to $i_4$.

Figure 11:
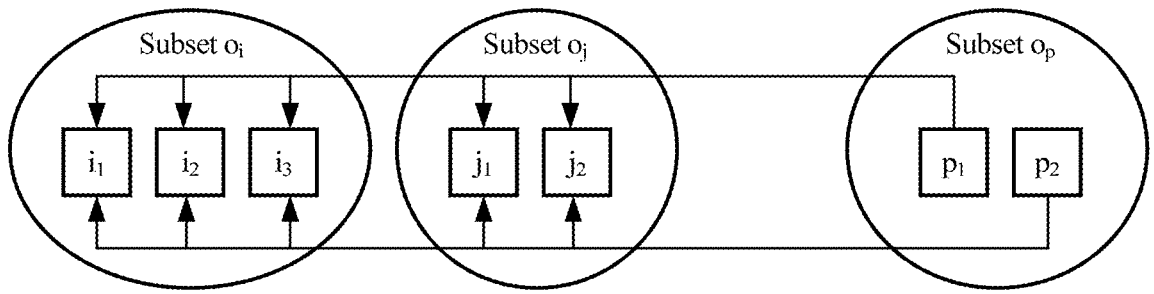
FIG. 11 is still another schematic diagram of a check relationship.

FIG. 11 is still another schematic diagram of a check relationship. As shown in FIG. 11, a PC bit may also be used to check information bits in a plurality of subsets.

For example, if a mother code length N is equal to 16, a quantity K of information bits is equal to 4, a quantity $K_{pc}$ of PC bits is equal to 2, and the determined information bit location set is {15}, {14}, {11}, and {10}, one or more subsets are selected from the remaining subsets, so that a quantity of subchannels included in the one or more subsets is 2, and a sum of reliability of the subchannels is largest. A PC bit location set that meets this requirement is {7, 13}. The check equation may be that a PC bit on the channel 7 is used to check information bits on channels 10, 11, 14, and 15, and a PC bit on the channel 13 is also used to check the information bits on the channels 10, 11, 14, and 15.

The manners of determining the PC equation in FIG. 10 and FIG. 11 are used to determine a PC bit location in Implementation 5 and Implementation 8.

According to the coding method provided in this embodiment of this application, the sending device divides the subchannel location sequence number set into the at least two mutually exclusive subsets based on the interleaving operation, determines the information bit location set and the frozen bit location set of the to-be-coded polar polar code based on the at least two mutually exclusive subsets, and codes the to-be-coded polar code based on the information bit location set and the frozen bit location set. The subchannel location in each subset obtained by the sending device based on the interleaving operation still belongs to the subset after any quantity of interleaving operations are performed, and the information bit location set and the frozen bit location set are selected from the foregoing subsets. Therefore, after a polar code is applied to a PBCH, communication performance of polar coding can be further improved. In addition, after the interleaving operation is performed on the polar polar code, a relatively large quantity of redundant versions are obtained, and more information may be implicitly carried.

Figure 12:
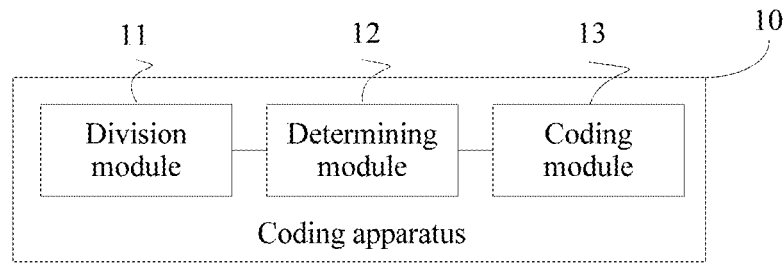
FIG. 12 is a schematic structural diagram of a coding apparatus according to an embodiment of this application.

FIG. 12 is a schematic structural diagram of a coding apparatus according to an embodiment of this application. As shown in FIG. 12, the coding apparatus 10 includes:

The coding apparatus provided in this embodiment is configured to implement the technical solutions provided in any one of the foregoing method embodiments. Implementation principles and technical effects of the apparatus are similar to those of the method, and details are not described herein again.

In one embodiment, the information bit location set and the frozen bit location set are determined based on reliability of the at least two mutually exclusive subsets.

In one embodiment, the reliability of the subset is a minimum value of reliability of subchannels in the subset or an average of reliability of subchannels in the subset.

In one embodiment, the reliability of the subset is a reverse value of a maximum location sequence number in location sequence numbers that are of subchannels in the subset and that are corresponding to a first constructed sequence, and the first constructed sequence is a sequence obtained through sorting in descending order of reliability of subchannels In one embodiment, the reliability of the subset is a maximum location sequence number in location sequence numbers that are of subchannels in the subset and that are corresponding to a second constructed sequence, and the second constructed sequence is a sequence obtained through sorting in ascending order of reliability of subchannels In one embodiment, the information bit location set is a set of subchannel location sequence numbers in a subsets selected based on the reliability of the subsets, a total quantity of the subchannel location sequence numbers in the a subsets is equal to a quantity of information bits, a sum of reliability of subchannels in the a subsets is greater than a sum of reliability of subchannels in any one or more other subsets in which a quantity of the subchannels is equal to the quantity of information bits, and a is a positive integer.

In one embodiment, the frozen bit location set is a set of subchannel location sequence numbers other than the information bit location set in the at least two mutually exclusive subsets.

In one embodiment, if the to-be-coded polar code includes a parity check PC bit set, a location set of the PC bit set includes c maximum subchannel sequence numbers selected from c subsets, the c subsets are selected from b subsets, and the b subsets are selected based on the reliability of the subsets, where a total quantity of subchannel sequence numbers in the b subsets is a sum of a quantity of information bits and a quantity of PC bit sets, a sum of reliability of subchannels in the b subsets is greater than a sum of reliability of subchannels in any one or more other subsets in which a quantity of the subchannels is equal to the sum of the quantity of information bits and the quantity of PC bits, a quantity of ones in binary expressions of subchannel sequence numbers in the c subsets is not greater than a quantity of ones in binary expressions of subchannel sequence numbers in the other (b–c) subsets, c is the quantity of PC bits, both b and c are positive integers, and c is not greater than b.

In one embodiment, the information bit location set is a set of subchannel location sequence numbers other than the location set of the PC bit set in the b subsets.

In one embodiment, the frozen bit location set is a set of subchannel location sequence numbers other than the information bit location set and the PC bit location set in the at least two mutually exclusive subsets.

In one embodiment, if the to-be-coded polar code includes a PC bit set, the information bit location set is a set of subchannel location sequence numbers in r subsets selected based on the reliability of the subsets, a total quantity of the subchannel location sequence numbers in the r subsets is equal to a quantity of information bits, and a sum of reliability of subchannels in the r subsets is greater than a sum of reliability of subchannels in any one or more other subsets in which a quantity of the subchannels is equal to the quantity of information bits; a location set of the PC bit set is a set of subchannel location sequence numbers in y subsets that are selected from m subsets other than the r subsets in the at least two mutually exclusive subsets based on the reliability of the subsets, a total quantity of the subchannel location sequence numbers in the y subsets is equal to a quantity of PC bits, and a sum of reliability of subchannels in the y subsets is greater than a sum of reliability of subchannels in any one or more other subsets, in the m subsets, in which a quantity of the subchannels is equal to the quantity of PC bits; and the frozen bit location set is a set of subchannel location sequence numbers other than the information bit location set and the PC bit location set in the at least two mutually exclusive subsets; where r, m, and y are positive integers.

In one embodiment, the frozen bit location set is a set of subchannel location sequence numbers in e subsets selected based on the reliability of the subsets, a total quantity of the subchannel location sequence numbers in the e subsets is equal to a quantity of frozen bits, a sum of reliability of subchannels in the e subsets is less than a sum of reliability of subchannels in any one or more other subsets in which a quantity of the subchannels is equal to the quantity of frozen bits, and e is a positive integer.

In one embodiment, the information bit location set is a set of subchannel location sequence numbers in g subsets including f subchannel sequence numbers in the first constructed sequence or the second constructed sequence, a total quantity of the subchannel location sequence numbers in the g subsets is equal to a quantity of information bits, and both f and g are positive integers.

In one embodiment, if the to-be-coded polar code includes a PC bit, a PC bit location set includes j maximum subchannel sequence numbers selected from j subsets, and the j subsets are selected from i subsets after a set of subchannel location sequence numbers in the i subsets including h subchannel sequence numbers in the first constructed sequence or the second constructed sequence is determined; where a total quantity of the subchannel sequence numbers in the i subsets is a sum of a quantity of information bits and a quantity of PC bits, a quantity of ones in binary expressions of the subchannel sequence numbers in the j subsets is not greater than a quantity of ones in binary expressions of subchannel sequence numbers in the other (i−j) subsets, j is the quantity of PC bits, h, i, j are all positive integers, and j is not greater than i.

In one embodiment, the information bit location set is a set of subchannel location sequence numbers other than the PC bit location set in the i subsets; and the frozen bit location set is a set of subchannel location sequence numbers other than the information bit location set and the PC bit location set in the at least two mutually exclusive subsets.

In one embodiment, if the to-be-coded polar code includes a PC bit, the information bit location set is a set of subchannel location sequence numbers in n subsets including p subchannel sequence numbers in the first constructed sequence or the second constructed sequence, and a total quantity of the subchannel location sequence numbers in the n subsets is equal to a quantity of information bits; a PC bit location set is a set of subchannel location sequence numbers in C subsets that include B subchannel sequence numbers in the first constructed sequence or the second constructed sequence and that are selected from A subsets other than the n subsets in the at least two mutually exclusive subsets, and a total quantity of the subchannel location sequence numbers in the C subsets is equal to a quantity of PC bits; and the frozen bit is a set of subchannel location sequence numbers other than the information bit location set and the PC bit location set in the at least two mutually exclusive subsets; where p, n, A, B, and C are positive integers.

In one embodiment, the frozen bit location set is a set of subchannel location sequence numbers in t subsets including s subchannel sequence numbers in the first constructed sequence or the second constructed sequence, a total quantity of subchannels in the t subsets is equal to a quantity of frozen bits, and both s and t are positive integers.

In one embodiment, the determining module 12 is further configured to determine a punctured bit location set when rate matching is required; where the punctured bit location set is a set of subchannel location sequence numbers in w subsets that are selected according to a preset rule from a set of subchannel location sequence numbers other than the information bit location set in the at least two mutually exclusive subsets, and a total quantity of the subchannel location sequence numbers in the w subsets is equal to a quantity of punctured bits; or the punctured bit location set is a set of subchannel location sequence numbers in x subsets that are selected according to a preset rule from a set of subchannel location sequence numbers other than the information bit location set and a PC bit location set in the at least two mutually exclusive subsets, and a total quantity of the subchannel location sequence numbers in the x subsets is equal to a quantity of punctured bits.

In one embodiment, the coding apparatus is applied to transmission of a physical broadcast channel PBCH in a wireless communications system.

The coding apparatus provided in any one of the foregoing embodiments is configured to implement the technical solutions provided in any one of the foregoing method embodiments. Implementation principles and technical effects of the apparatus are similar to those of the method, and details are not described herein again.

It should be understood that, in the implementations of the coding apparatus, the division module, the determining module, and the coding module may be implemented as a processor.

This application further provides a sending device, including a memory, a processor, and a computer program. The computer program is saved in the memory. When the program is executed, the processor divides a subchannel location sequence number set into at least two mutually exclusive subsets based on an interleaving operation, where a subchannel location in each subset still belongs to the subset and does not belong to another subset after any quantity of interleaving operations are performed; determines an information bit location set and a frozen bit location set of a to-be-coded polar polar code based on the at least two mutually exclusive subsets; and codes the to-be-coded polar code based on the information bit location set and the frozen bit location set.

In one embodiment, the information bit location set and the frozen bit location set are determined based on reliability of the at least two mutually exclusive subsets.

In one embodiment, the reliability of the subset is a minimum value of reliability of subchannels in the subset or an average of reliability of subchannels in the subset.

In one embodiment, the reliability of the subset is a reverse value of a maximum location sequence number in location sequence numbers that are of subchannels in the subset and that are corresponding to a first constructed sequence, and the first constructed sequence is a sequence obtained through sorting in descending order of reliability of subchannels In one embodiment, the reliability of the subset is a maximum location sequence number in location sequence numbers that are of subchannels in the subset and that are corresponding to a second constructed sequence, and the second constructed sequence is a sequence obtained through sorting in ascending order of reliability of subchannels In one embodiment, the information bit location set is a set of subchannel location sequence numbers in a subsets selected based on the reliability of the subsets, a total quantity of the subchannel location sequence numbers in the a subsets is equal to a quantity of information bits, a sum of reliability of subchannels in the a subsets is greater than a sum of reliability of subchannels in any one or more other subsets in which a quantity of the subchannels is equal to the quantity of information bits, and a is a positive integer.

In one embodiment, the frozen bit location set is a set of subchannel location sequence numbers other than the information bit location set in the at least two mutually exclusive subsets.

In one embodiment, if the to-be-coded polar code includes a parity check PC bit set, a location set of the PC bit set includes c maximum subchannel sequence numbers selected from c subsets, the c subsets are selected from b subsets, and the b subsets are selected based on the reliability of the subsets, where a total quantity of subchannel sequence numbers in the b subsets is a sum of a quantity of information bits and a quantity of PC bit sets, a sum of reliability of subchannels in the b subsets is greater than a sum of reliability of subchannels in any one or more other subsets in which a quantity of the subchannels is equal to the sum of the quantity of information bits and the quantity of PC bits, a quantity of ones in binary expressions of subchannel sequence numbers in the c subsets is not greater than a quantity of ones in binary expressions of subchannel sequence numbers in the other (b−c) subsets, c is the quantity of PC bits, both b and c are positive integers, and c is not greater than b.

In one embodiment, the information bit location set is a set of subchannel location sequence numbers other than the location set of the PC bit set in the b subsets.

In one embodiment, the frozen bit location set is a set of subchannel location sequence numbers other than the information bit location set and the PC bit location set in the at least two mutually exclusive subsets.

In one embodiment, if the to-be-coded polar code includes a PC bit set, the information bit location set is a set of subchannel location sequence numbers in r subsets selected based on the reliability of the subsets, a total quantity of the subchannel location sequence numbers in the r subsets is equal to a quantity of information bits, and a sum of reliability of subchannels in the r subsets is greater than a sum of reliability of subchannels in any one or more other subsets in which a quantity of the subchannels is equal to the quantity of information bits; a location set of the PC bit set is a set of subchannel location sequence numbers in y subsets that are selected from m subsets other than the r subsets in the at least two mutually exclusive subsets based on the reliability of the subsets, a total quantity of the subchannel location sequence numbers in the y subsets is equal to a quantity of PC bits, and a sum of reliability of subchannels in the y subsets is greater than a sum of reliability of subchannels in any one or more other subsets, in the m subsets, in which a quantity of the subchannels is equal to the quantity of PC bits; and the frozen bit location set is a set of subchannel location sequence numbers other than the information bit location set and the PC bit location set in the at least two mutually exclusive subsets; where r, m, and y are positive integers.

In one embodiment, the frozen bit location set is a set of subchannel location sequence numbers in e subsets selected based on the reliability of the subsets, a total quantity of the subchannel location sequence numbers in the e subsets is equal to a quantity of frozen bits, a sum of reliability of subchannels in the e subsets is less than a sum of reliability of subchannels in any one or more other subsets in which a quantity of the subchannels is equal to the quantity of frozen bits, and e is a positive integer.

In one embodiment, the information bit location set is a set of subchannel location sequence numbers in g subsets including f subchannel sequence numbers in the first constructed sequence or the second constructed sequence, a total quantity of the subchannel location sequence numbers in the g subsets is equal to a quantity of information bits, and both f and g are positive integers.

In one embodiment, if the to-be-coded polar code includes a PC bit, a PC bit location set includes j maximum subchannel sequence numbers selected from j subsets, and the j subsets are selected from i subsets after a set of subchannel location sequence numbers in the i subsets including h subchannel sequence numbers in the first constructed sequence or the second constructed sequence is determined; where a total quantity of the subchannel sequence numbers in the i subsets is a sum of a quantity of information bits and a quantity of PC bits, a quantity of ones in binary expressions of the subchannel sequence numbers in the j subsets is not greater than a quantity of ones in binary expressions of subchannel sequence numbers in the other (i−j) subsets, j is the quantity of PC bits, h, i, j are all positive integers, and j is not greater than i.

In one embodiment, the information bit location set is a set of subchannel location sequence numbers other than the PC bit location set in the i subsets; and the frozen bit location set is a set of subchannel location sequence numbers other than the information bit location set and the PC bit location set in the at least two mutually exclusive subsets.

In one embodiment, if the to-be-coded polar code includes a PC bit, the information bit location set is a set of subchannel location sequence numbers in n subsets including p subchannel sequence numbers in the first constructed sequence or the second constructed sequence, and a total quantity of the subchannel location sequence numbers in the n subsets is equal to a quantity of information bits; a PC bit location set is a set of subchannel location sequence numbers in C subsets that include B subchannel sequence numbers in the first constructed sequence or the second constructed sequence and that are selected from A subsets other than the n subsets in the at least two mutually exclusive subsets, and a total quantity of the subchannel location sequence numbers in the C subsets is equal to a quantity of PC bits; and the frozen bit is a set of subchannel location sequence numbers other than the information bit location set and the PC bit location set in the at least two mutually exclusive subsets; where p, n, A, B, and C are positive integers.

In one embodiment, the frozen bit location set is a set of subchannel location sequence numbers in t subsets including s subchannel sequence numbers in the first constructed sequence or the second constructed sequence, a total quantity of subchannels in the t subsets is equal to a quantity of frozen bits, and both s and t are positive integers.

In one embodiment, the processor is further configured to determine a punctured bit location set when rate matching is required; where the punctured bit location set is a set of subchannel location sequence numbers in w subsets that are selected according to a preset rule from a set of subchannel location sequence numbers other than the information bit location set in the at least two mutually exclusive subsets, and a total quantity of the subchannel location sequence numbers in the w subsets is equal to a quantity of punctured bits; or the punctured bit location set is a set of subchannel location sequence numbers in x subsets that are selected according to a preset rule from a set of subchannel location sequence numbers other than the information bit location set and a PC bit location set in the at least two mutually exclusive subsets, and a total quantity of the subchannel location sequence numbers in the x subsets is equal to a quantity of punctured bits.

In one embodiment, the sending device is applied to transmission of a physical broadcast channel PBCH in a wireless communications system.

In the embodiments of the sending device, there is at least one processor configured to execute an execution instruction, in other words, a computer program, stored in the memory. The sending device exchanges data with a receiving device through a communications interface, so as to execute the coding method provided in any one of the foregoing implementations. In one embodiment, the memory may be integrated into the processor.

This application further provides a storage medium, including a readable storage medium and a computer program. The computer program is used to implement the coding method provided in any one of the foregoing embodiments.

This application further provides a program product. The program product includes a computer program (an execution instruction), and the computer program is stored in a readable storage medium. At least one processor of a sending device may read the computer program from the readable storage medium. The at least one processor executes the computer program, so that the sending device implements the coding method provided in the foregoing various implementations.

In the foregoing implementation of the transmit device, it should be understood that the processor may be a central processing unit (CPU), or may be another general-purpose processor, a digital signal processor (DSP), an application-specific integrated circuit (ASIC), or the like. The general-purpose processor may be a microprocessor, or the processor may be any conventional processor or the like. The operations of the methods disclosed with reference to this application may be directly implemented by a hardware processor, or may be implemented by a combination of hardware and a software module in a processor.

All or some of the operations of the foregoing method embodiments may be implemented by using hardware related to a program instruction. The foregoing program may be stored in a computer-readable memory. When the program is executed, the operations of the methods in the embodiments are performed. The memory (storage medium) includes: a read-only memory (ROM), a RAM, a flash memory, a hard disk, a solid state disk, a magnetic tape, a floppy disk, an optical disc, and any combination thereof.

The invention claimed is:

1. A method for coding, comprising:
   dividing, by a sending device, a subchannel location sequence number set into at least two mutually exclusive subsets based on an interleaving operation, wherein a subchannel location in each subset belongs to the subset and does not belong to another subset after any quantity of interleaving operations are performed;
   determining, by the sending device, an information bit location set and a frozen bit location set of a to-be-coded polar code based on the at least two mutually exclusive subsets; and
   coding, by the sending device, the to-be-coded polar code based on the information bit location set and the frozen bit location set.

2. The method according to claim 1, wherein the information bit location set and the frozen bit location set are determined based on reliability of the at least two mutually exclusive subsets.

3. The method according to claim 2, wherein the reliability of each subset is a minimum value of reliability of subchannels in the subset or an average of reliability of subchannels in the subset.

4. The method according to claim 2, wherein the reliability of each subset is a reverse value of a maximum location sequence number in location sequence numbers that are of subchannels in the subset and that are corresponding to a first constructed sequence, and the first constructed sequence is a sequence obtained through sorting in descending order of reliability of subchannels.

5. The method according to claim 2, wherein the reliability of each subset is a maximum location sequence number in location sequence numbers that are of subchannels in the subset and that are corresponding to a second constructed sequence, and the second constructed sequence is a sequence obtained through sorting in ascending order of reliability of subchannels.

6. The method according to claim 2, wherein the information bit location set is a set of subchannel location sequence numbers in a subsets selected based on the reliability of the subsets, a total quantity of the subchannel location sequence numbers in the a subsets is equal to a quantity of information bits, a sum of reliability of subchannels in the a subsets is greater than a sum of reliability of subchannels in any one or more other subsets in which a quantity of the subchannels is equal to the quantity of information bits, and a is a positive integer.

7. The method according to claim 6, wherein the frozen bit location set is a set of subchannel location sequence numbers other than the information bit location set in the at least two mutually exclusive subsets.

8. The method according to claim 2, wherein if the to-be-coded polar code comprises a parity check (PC) bit set, a location set of the PC bit set comprises c maximum subchannel sequence numbers selected from c subsets, the c subsets are selected from b subsets, and the b subsets are selected based on the reliability of the subsets, wherein a total quantity of subchannel sequence numbers in the b subsets is a sum of a quantity of information bits and a quantity of PC bit sets, a sum of reliability of subchannels in the b subsets is greater than a sum of reliability of subchannels in any one or more other subsets in which a quantity of the subchannels is equal to the sum of the quantity of information bits and the quantity of PC bits, a quantity of is in binary expressions of subchannel sequence numbers in the c subsets is not greater than a quantity of ones in binary expressions of subchannel sequence numbers in the other (b-c) subsets, c is the quantity of PC bits, wherein, both b and c are positive integers, and c is not greater than b.

9. The method according to claim 2, wherein if the to-be-coded polar code comprises a PC bit set, the information bit location set is a set of subchannel location sequence numbers in r subsets selected based on the reliability of the subsets, a total quantity of the subchannel location sequence numbers in the r subsets is equal to a quantity of information bits, and a sum of reliability of subchannels in the r subsets is greater than a sum of reliability of subchannels in any one or more other subsets in which a quantity of the subchannels is equal to the quantity of information bits; a location set of the PC bit set is a set of subchannel location sequence numbers in y subsets that are selected from m subsets other than the r subsets in the at least two mutually exclusive subsets based on the reliability of the subsets, a total quantity of the subchannel location sequence numbers in they subsets is equal to a quantity of PC bits, and a sum of reliability of subchannels in they subsets is greater than a sum of reliability of subchannels in any one or more other subsets, in the m subsets, in which a quantity of the subchannels is equal to the quantity of PC bits; and the frozen bit location set is a set of subchannel location sequence numbers other than the information bit location set and the PC bit location set in the at least two mutually exclusive subsets; wherein r, m, and y are positive integers.

10. The method according to claim 4, wherein the information bit location set is a set of subchannel location sequence numbers in g subsets comprising f subchannel sequence numbers in the first constructed sequence or a second constructed sequence, a total quantity of the subchannel location sequence numbers in the g subsets is equal to a quantity of information bits, and both f and g are positive integers.

11. A coding apparatus comprising:
   a division module configured to divide a subchannel location sequence number set into at least two mutually exclusive subsets based on an interleaving operation, wherein a subchannel location in each subset belongs to the subset and does not belong to another subset after any quantity of interleaving operations are performed;

a determining module configured to determine an information bit location set and a frozen bit location set of a to-be-coded polar code based on the at least two mutually exclusive subsets; and a coding module configured to code the to-be-coded polar code based on the information bit location set and the frozen bit location set.

12. The apparatus according to claim 11, wherein the information bit location set and the frozen bit location set are determined based on reliability of the at least two mutually exclusive subsets.

13. The apparatus according to claim 12, wherein the reliability of each subset is a minimum value of reliability of subchannels in the subset or an average of reliability of subchannels in the subset.

14. The apparatus according to claim 12, wherein the reliability of each subset is a reverse value of a maximum location sequence number in location sequence numbers that are of subchannels in the subset and that are corresponding to a first constructed sequence, and the first constructed sequence is a sequence obtained through sorting in descending order of reliability of subchannels.

15. The apparatus according to claim 12, wherein the reliability of each subset is a maximum location sequence number in location sequence numbers that are of subchannels in the subset and that are corresponding to a second constructed sequence, and the second constructed sequence is a sequence obtained through sorting in ascending order of reliability of subchannels.

16. A sending device comprising:
a memory configured to store a program; and
a processor configured to execute the program stored in the memory, wherein when the
program is executed, the processor is configured to:
divide a subchannel location sequence number set into at least two mutually exclusive subsets based on an interleaving operation, wherein a subchannel location in each subset belongs to the subset and does not belong to another subset after any quantity of interleaving operations are performed;
determine an information bit location set and a frozen bit location set of a to-be-coded polar code based on the at least two mutually exclusive subsets; and
code the to-be-coded polar code based on the information bit location set and the frozen bit location set.

17. A non-transitory computer-readable storage medium having instructions stored therein, which, when executed by a processor, causes the processor to:
divide a subchannel location sequence number set into at least two mutually exclusive subsets based on an interleaving operation, wherein a subchannel location in each subset belongs to the subset and does not belong to another subset after any quantity of interleaving operations are performed;
determine an information bit location set and a frozen bit location set of a to-be-coded polar code based on the at least two mutually exclusive subsets; and
code the to-be-coded polar code based on the information bit location set and the frozen bit location set.

* * * * *

UNITED STATES PATENT AND TRADEMARK OFFICE
CERTIFICATE OF CORRECTION

PATENT NO. : 10,992,318 B2  
APPLICATION NO. : 16/673589  
DATED : April 27, 2021  
INVENTOR(S) : Wang et al.

Page 1 of 1

It is certified that error appears in the above-identified patent and that said Letters Patent is hereby corrected as shown below:

In the Claims

Claim 8, Column 40, Line 23, replace "quantity of is in binary expressions" with --quantity of 1s in binary expressions--.

Signed and Sealed this  
Twentieth Day of July, 2021

Drew Hirshfeld  
*Performing the Functions and Duties of the*  
*Under Secretary of Commerce for Intellectual Property and*  
*Director of the United States Patent and Trademark Office*